US 6,616,030 B2

(12) United States Patent
Miller

(10) Patent No.: US 6,616,030 B2
(45) Date of Patent: Sep. 9, 2003

(54) GANTRY MOUNTED ULTRASONIC WIRE BONDER WITH ORBITAL BONDING TOOL HEAD

(75) Inventor: Charles F. Miller, Anaheim Hills, CA (US)

(73) Assignee: West Bond, Inc., Ahaheim, CA (US)

( * ) Notice: Subject to any disclaimer, the term of this patent is extended or adjusted under 35 U.S.C. 154(b) by 0 days.

(21) Appl. No.: 09/850,051

(22) Filed: May 7, 2001

(65) Prior Publication Data

US 2002/0162875 A1 Nov. 7, 2002

(51) Int. Cl.⁷ .............................. B23K 20/10; B23K 1/06
(52) U.S. Cl. ........................ 228/4.5; 228/1.1; 228/110.1
(58) Field of Search .............................. 228/180.5, 4.5, 228/1.1, 110.1; 29/739

(56) References Cited

U.S. PATENT DOCUMENTS

| 3,474,685 A | * | 10/1969 | Miller | 269/58 |
| 3,626,590 A | * | 12/1971 | Miller | 140/111 |
| 3,773,240 A | * | 11/1973 | Heim | 228/4.5 |
| 3,941,294 A | * | 3/1976 | Johannsmeier | 228/4.5 |
| 4,475,681 A | * | 10/1984 | Ingle | 219/56.21 |
| 5,702,049 A | * | 12/1997 | Biggs et al. | 228/105 |
| 5,871,136 A | * | 2/1999 | Miller | 228/180.5 |
| 5,897,048 A | * | 4/1999 | Cheng et al. | 228/180.5 |
| 6,102,275 A | * | 8/2000 | Hill et al. | 228/103 |
| 6,109,501 A | * | 8/2000 | Cheng et al. | 228/1.1 |
| 6,164,514 A | * | 12/2000 | Miller | 228/1.1 |
| 6,196,445 B1 | * | 3/2001 | Fogal et al. | 228/180.5 |

* cited by examiner

Primary Examiner—M. Alexandra Elve
Assistant Examiner—Len Tran
(74) Attorney, Agent, or Firm—William L. Chapin

(57) ABSTRACT

An automatic ultrasonic wire bonding machine for bonding interconnecting wires to electrically conductive sites on a workpiece includes a gantry which supports a generally downwardly cascaded series of support platforms linearly translatable with respect to the gantry and to one another in response to translation drive signals provided from a remote source to a separate translation motor for each platform. A head support assembly mounted to the last translatable platform in the series rotatably supports via a hollow elongated spindle an orbital bonding tool head rotatable with respect to the head support assembly in response to a rotational drive signals provided to a head rotation motor from a remote source. The orbital bonding tool head in turn supports via a novel parallelogram linkage an ultrasonic transducer having fitted therein a downwardly protruding ultrasonic bonding tool, the parallelogram linkage enabling the tool tip to be displaced only vertically in response to reaction forces exerted on the tip in translating the tip downwardly into contact with a workpiece.

67 Claims, 32 Drawing Sheets

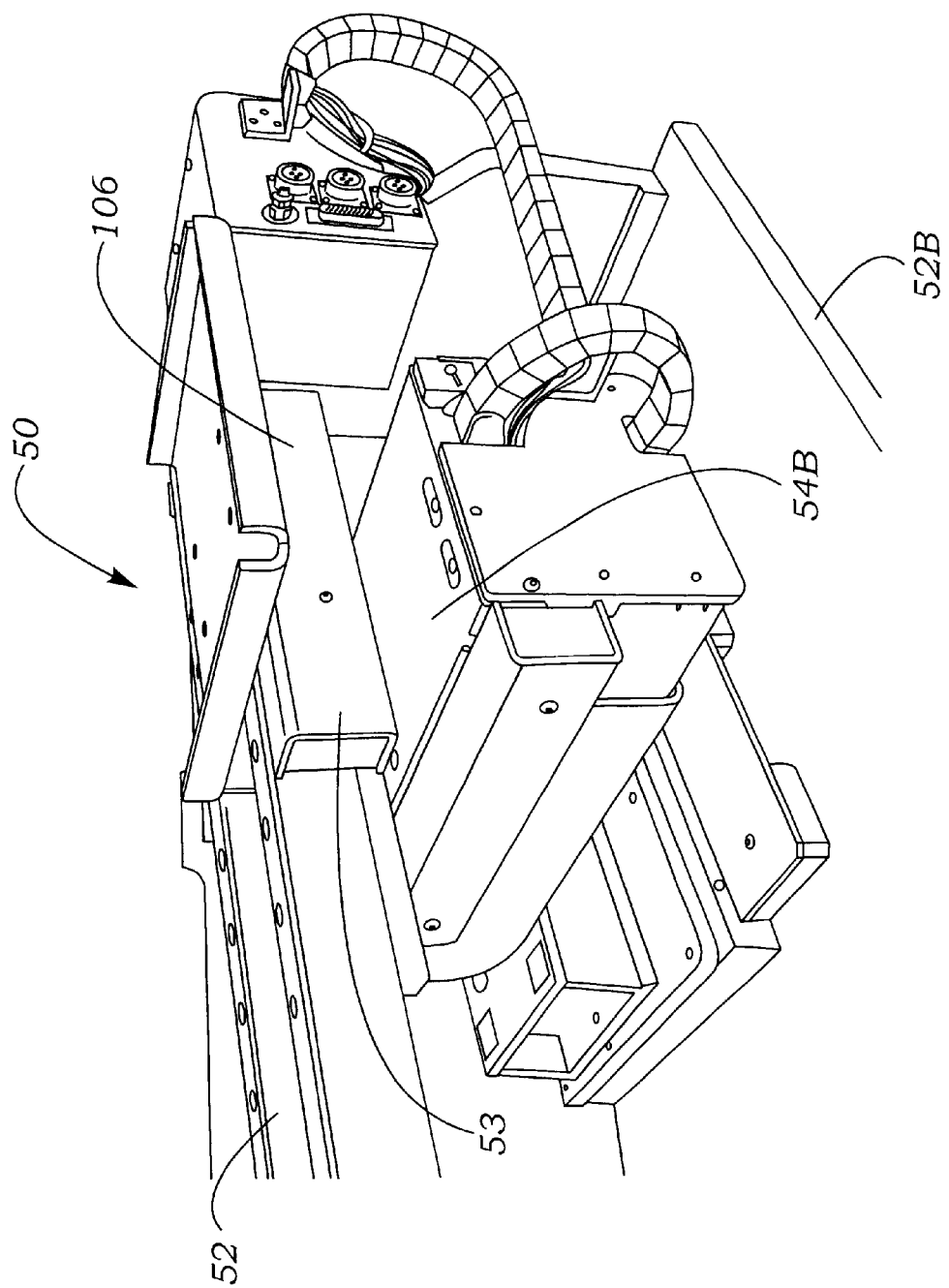

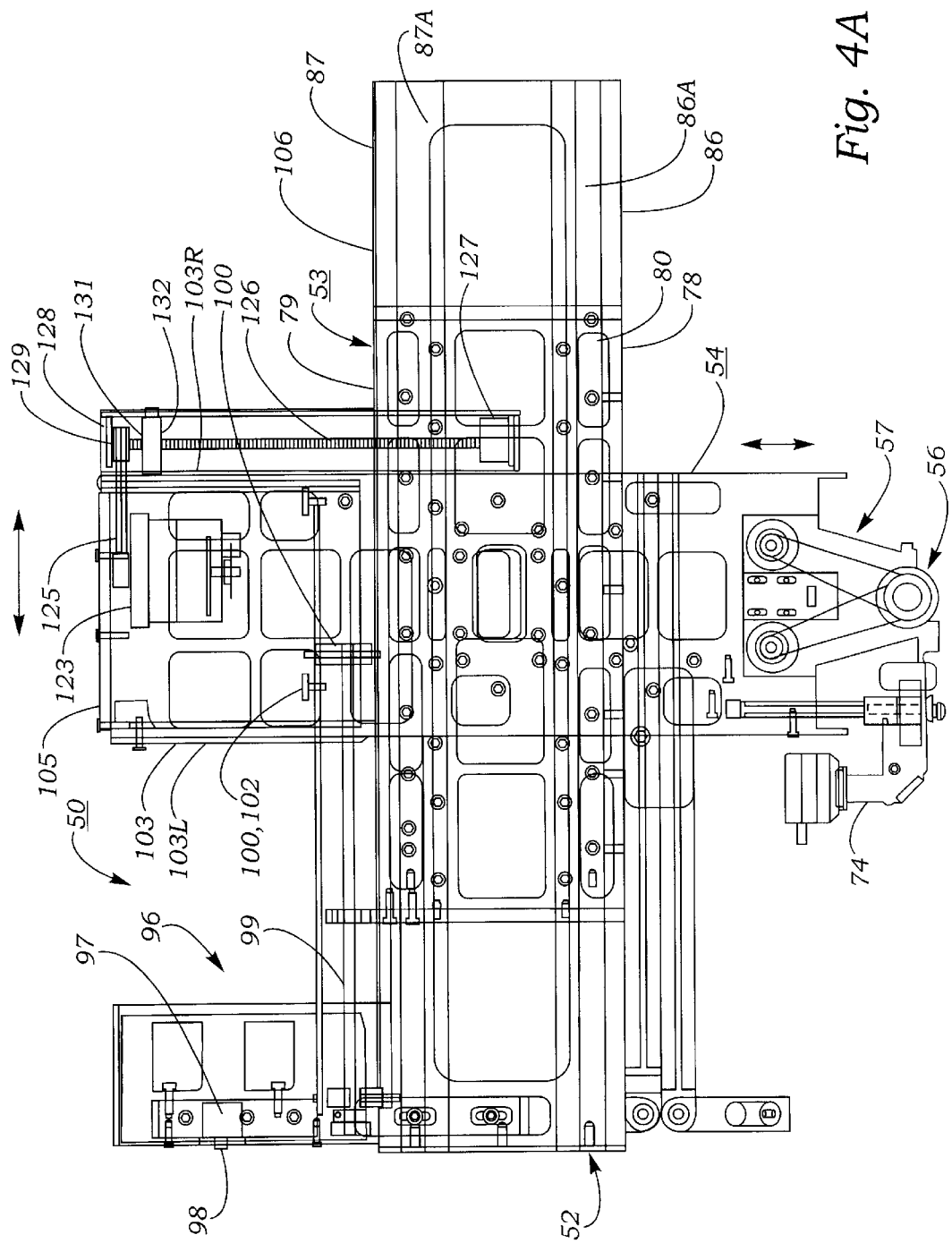

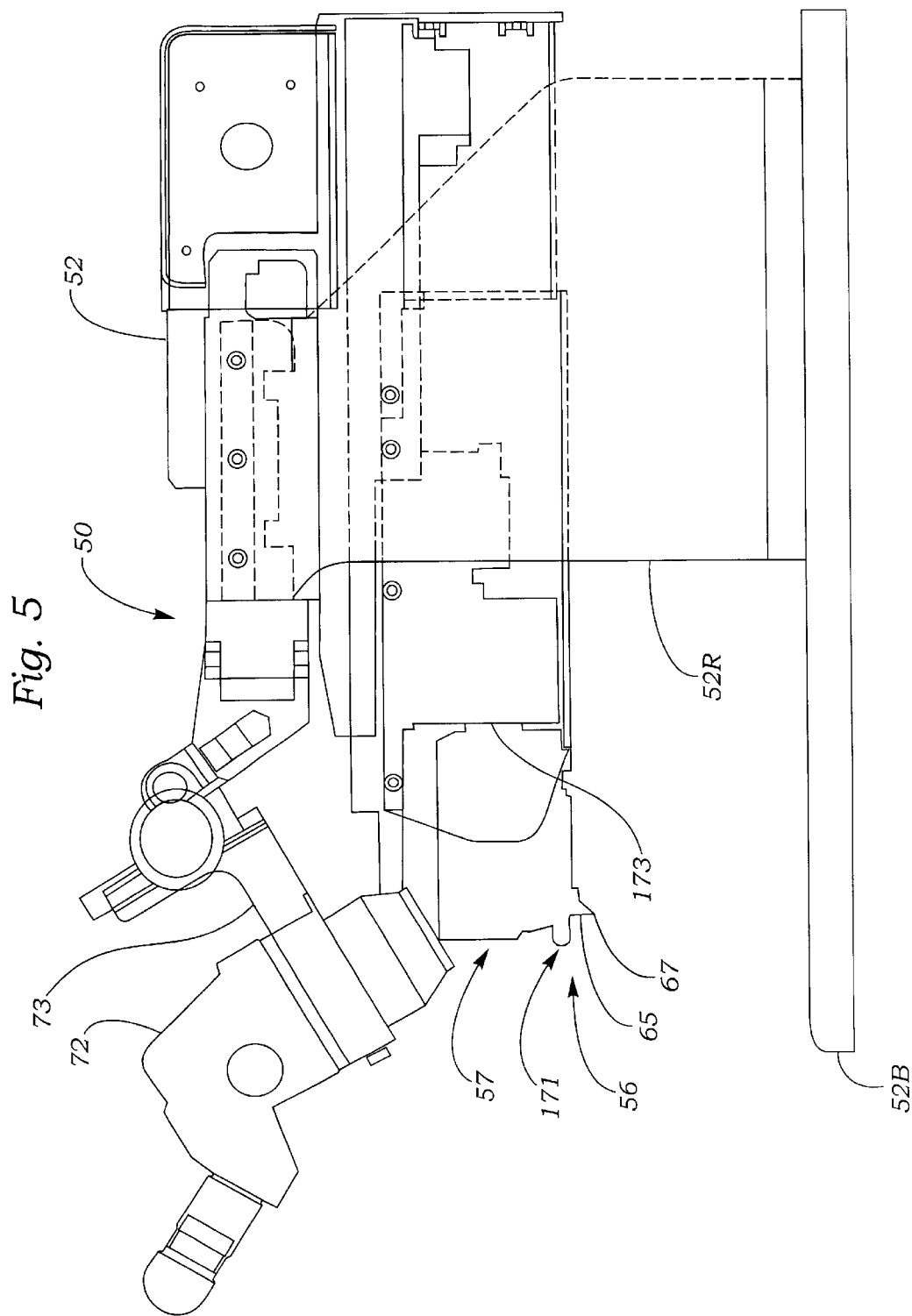

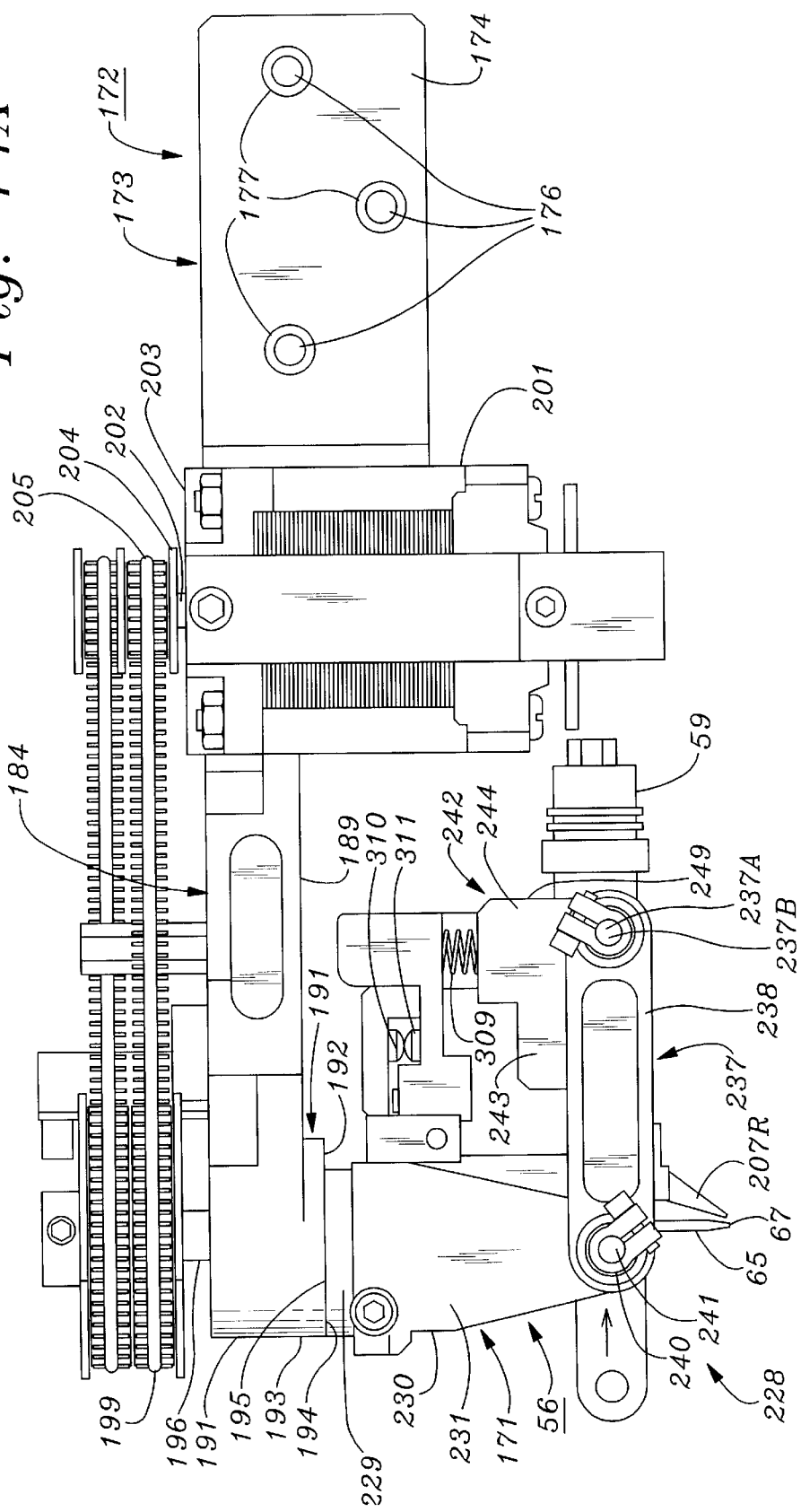

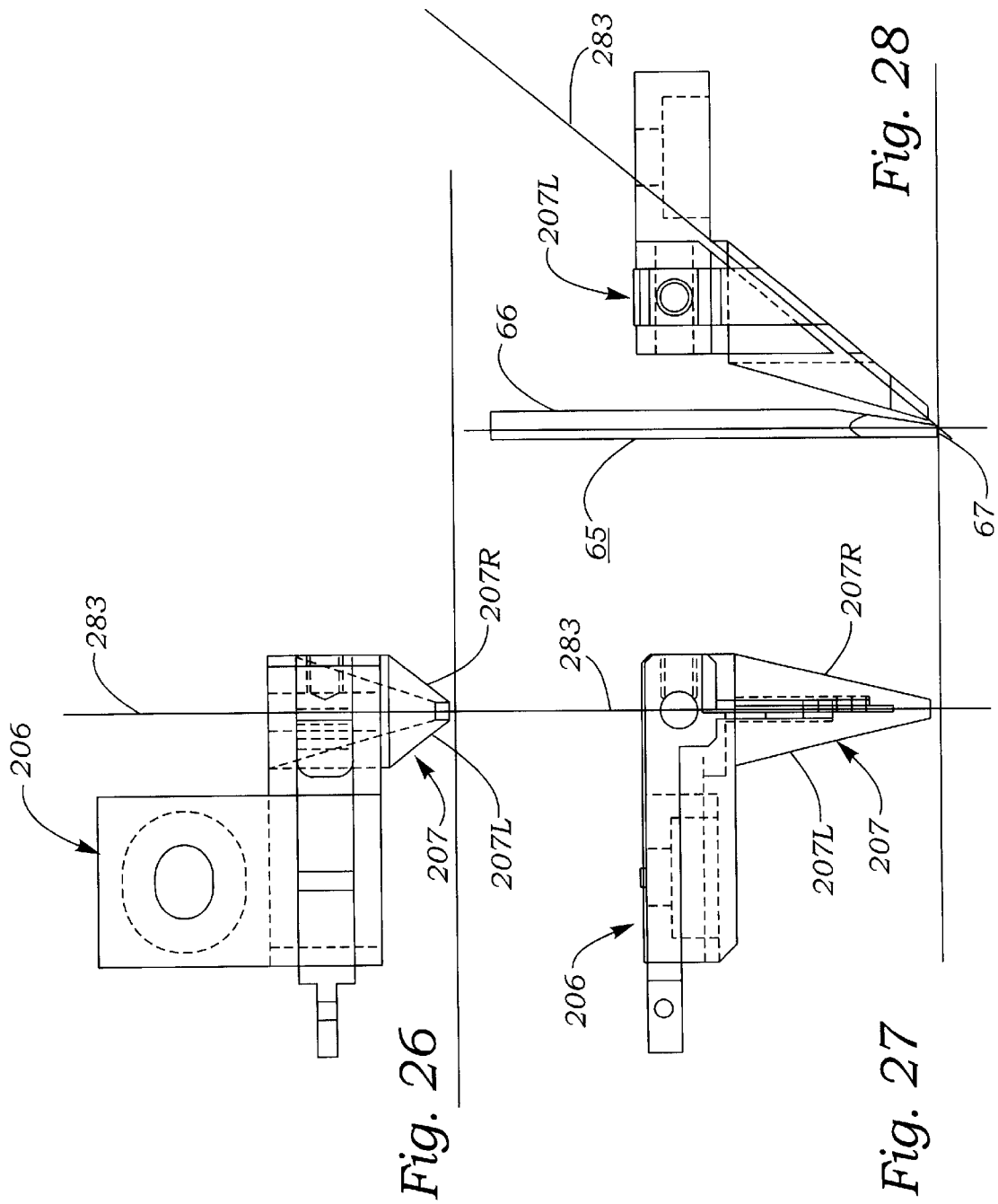

GANTRY MOUNTED ULTRASONIC WIRE BONDER WITH ORBITAL BONDING TOOL HEAD

BACKGROUND OF THE INVENTION

A. Field of the Invention

The present invention relates to machines and apparatus for making ultrasonic wire bonds on miniature workpieces such as microcircuits and read/write heads of the type used to read data from and write data to disk memories. More particularly, the invention relates to an automatic ultrasonic bonding machine that includes an orbital head rotatable by a motor drive, thus enabling an ultrasonic wedge-type wire bonding tool protruding from the head to be oriented in arbitrary azimuthal directions, thereby enabling wire to be paid out without twisting through a wire feed bore disposed diagonally through the bonding tool, from a first bond site to subsequent bond sites located at arbitrary compass directions from the first bond site, without requiring that the workpiece be rotated.

B. Description of Background Art

Miniature electronic circuits, or "micro-circuits," are used in vast quantities, in a wide variety of consumer, commercial, industrial and military devices and equipment. The majority of such micro-circuits are of a type referred to as integrated circuits. Integrated circuits contain a number of active circuit elements such as transistors, and passive elements such as resistors and capacitors. In semiconductor integrated circuits, conductive paths between circuit elements on a semiconductor substrate are formed by selectively etching the substrate. In hybrid micro-circuits, circuit elements mounted on a ceramic substrate are usually interconnected by conductive ink paths on the substrate.

The functional portions of integrated circuits are typically in the form of very small, rectangular-shaped chips, ranging in size from 0.025 inch to 0.200 inch or more on a side. Input connections to integrated circuit chips are often made by bonding a very fine wire to conductive pads on the chips, the other end of each wire being bonded to a conductive terminal that is sufficiently large and robust to be inserted into a printed circuit board and soldered to conductors on the board. Wire bonding of this type utilizes ultrasonic energy and/or heat to form an intermetallic bond or weld between the wire and metallic bond site. Such wire bonds are also used to form interconnections between pads of integrated circuits, and to connect lead-out terminals to delicate read/write heads used in disk memories.

Typically, bonding wires used to interconnect the pads of a semiconductor chip to terminals of a package containing the chip are made of aluminum or gold, and have a diameter of about 1 mil (0.001 inch). Those wires must be bonded to small, typically rectangular-shaped, integrated circuit pads a few mils wide.

The most common method of interconnecting wires between semiconductor chip pads and external terminals is to form an ultrasonic weld at each end of a conducting wire. To form such bonds, the free end of a length of bonding wire is placed in contact with a pad. Then the tip of an ultrasonic transducer is pressed against the wire, and energized with ultrasonic energy for a short time interval, welding an end of the wire to the pad. The free end of the bonded wire is then moved to other pads, and bonded thereto by the same process. After the last bond in a series of bonds has been thus formed, the wire is severed near the last bond.

In view of the very small size of the micro-circuit pads and bonding wire, it can be appreciated that ultrasonic bonding of connecting wires to integrated circuit pads must be performed using a tool mounted in a bonding machine that permits the tool to be manipulated to precisely controllable positions within a work area containing a workpiece.

Typical wire bonding machines used for ultrasonic welding of wires to micro-circuit pads includes an elongated, generally vertically disposed, force-applying member or "tool." The tool is connected at the upper end thereof to a source of ultrasonic energy, such as a piezoelectric transducer connected to an electrical energy source alternating at an ultrasonic frequency. Usually, the tool is connected to the transducer through a tapered horn structure that matches the acoustic input impedance of the tool to the output impedance of the transducer, which typically has a larger diameter than the tool.

One type of ultrasonic bonding tool used to bond wires to micro-circuit pads is referred to as a wedge bonder and has a flat lower working face adapted to press a bonding wire into contact with a pad, while ultrasonic energy is applied through the tool to the wire to form an ultrasonic weld. This working face is usually quite small, typically having a rectangular shape only about a few mils on a side, to permit bonding wire to small micro-circuit pads, without contacting adjacent circuit elements. Typically, this is done by first viewing a particular workpiece pad and tool tip in a stereo microscope and video camera to align a workpiece relative to a bonding machine, and then using an automatic actuator system to position the tool tip at consecutive bond site locations on the workpiece, using a control system which employs pattern recognition logic.

In most wire bonding machines, the bonding tool is so constructed as to facilitate the positioning of bonding wire over a pad, prior to performing the bonding operation. Such bonding tools may include an upwardly angled lower face rearward of the working face, and a generally vertically disposed rear face. An angled bore or wire guide hole having an entrance aperture in the rear face and an exit aperture in the angled lower face of the tool enables bonding wire supplied from a reel mounted upwardly and rearwardly of the tool to be paid out through the exit aperture in the angled lower face of the tool. Typically, a remotely actuable clamp located rearward of the wire guide hole entrance and movable with the tool is used to feed bonding wire through the guide hole.

The clamp used to push wire through the guide hole of a bonding tool usually consists of a pair of jaws that may alternately be closed to grip the wire, and opened to allow free travel of the wire. Generally, such clamps may be moved toward and away from the guide hole entrance, typically on a line of movement which coincides with the axis of the guide hole. To feed wire through the guide hole, the jaws of the clamp are first opened, and the clamp then moved away from the guide opened, and the clamp then moved away from the guide hole. The jaws are then closed to grip the wire, and then moved towards the guide hole, thus feeding wire through the guide hole.

In wire bonding machines of the type just described, the machine is used to translate the bonding tool to the proper position to bond wire to a first bond site of a pair of bond sites, such as a pad on an integrated circuit die, feed wire out through the guide hole exit aperture, move the tool to a second bond site and form another bond. In this manner, any desired number of pads or other elements of a circuit can be connected together, in a procedure referred to a "stitch" bonding. After the last bond in a series of bonds has been made, the wire must be severed, to permit making bonds between other pairs of bond sites. Oftentimes, the bonding tool itself is utilized to sever the bonding wire.

In moving a wedge bonding tool from a first bond site to a second bond site, the tool must be translated rearward from, the first site to the second site, in a vertical plane containing both the longitudinal axis and wire-guide bore axis of the tool. This requirement results from the fact that wire paying out forwardly through the exit aperture of the bonding tool tip must remain in the plane containing the longitudinal and guide hole axes of the tool, to ensure that the wire will not bind on the exit aperture chamfer, or become twisted.

Because of the requirement for translating a wedge bonding tool from a first to subsequent bond sites in the plane of the bonding tool longitudinal axis and wire guide bore axis, existing wedge bonding methods require that a workpiece be rotated to align a direction vector between the two sites with the bonding tool plane, and subsequent translation of the bonding tool rearwardly in that plane along the direction vector.

One method of performing the required relative translations and rotations of a wedge bonding tool relative to a workpiece utilizes a support platform for the workpiece, which is translatable in an X–Y plane perpendicular to the longitudinal axis of the bonding tool, and rotatable in the Y—Y plane. With this method, the bonding tool need only be translatable downwardly, in a minus −Z direction to effect a bond, and upwardly in a plus +Z direction after a bond has been made.

In some ultrasonic wire bonding applications, the bonding tool tip may move in arbitrary compass directions between first and succeeding bond sites. Thus, ball bonding tools, which feed bonding wire through a single capillary bore coaxial with the longitudinal axis of the tool may be translated in any direction between bond sites, without regard to the orientation of the tool, because of the azimuthal symmetry of the tool. For such applications, it is possible to translate the bonding tool in X and Y directions, as well as the Z direction, to make bonds between sites on a fixed workpiece. Thus, the present inventor disclosed in copending application, Ser. No. 09/570,196, filed May 12, 2000, an Automatic Ultrasonic Bonding Machine With Vertically Tiered Orthogonally Translatable Tool Support Platforms, which include a positioning mechanism for automatically translating the tip of an ultrasonic bonding tool by drive motors to precisely pre-determinable positions within a three-dimensional coordinate space containing a workpiece. The machine described in that application provides means for translating a bonding tool, in X–Y directions parallel to a plane containing a workpiece to position the tool tip over a particular bond site, translating the tool downwardly in a minus −Z direction to make an ultrasonic wire bond, translating the tool upwardly to withdraw its tip from the first bond site, and translating the tool in X–Y direction to position the tool over a subsequent intended bond site, and form thereat a subsequent bond. Thus, the disclosed machine eliminates the a requirement for a rotatable X–Y table for supporting a workpiece, and provides a highly effective method for making bonds on workpieces located on a conveyor, for example. The present invention was conceived of to further advance the wire bonding machine art, by providing a machine capable of making a sequence of wedge bonds without requiring either rotation or translation of a workpiece.

OBJECTS OF THE INVENTION

An object of the present invention is to provide a machine for positioning an ultrasonic wire bonding tool at precisely determinable first bond site locations relative to a workpiece, orbiting the bonding tool about its longitudinal axis to an arbitrary compass direction, and translating the tool in the compass direction to precisely determinable second bond site locations while maintaining the tool irrotational in the plane of translation to the second bond site location, thus allowing a bonding wire to pay out through an aperture through the bonding tool from said first location to said second location without twisting from the translating plane.

Another object of the invention is to provide an ultrasonic wire bonding machine having an orbital head which rotatably supports a wedge bonding tool having a wire feed bore which angles upwardly and rearwardly from the tip of the tool, whereby the head may be rotated to rotate a vertical plane containing the longitudinal axes of the tool and the wire feed bore to an arbitrary compass direction, thereby enabling the head to be translated rearwardly in that plane to pay out wire in the translation plane from a bond made at a first site on a workpiece by the tool to a second bond site, without requiring that the workpiece be rotated.

Another object of the invention is to provide an automatic ultrasonic wire bonding machine which includes means for translating a bonding tool to an arbitrary location within a defined workspace, and means for rotating the tool to thereby enable wire fixed at one end to a first bond site on a workpiece and at the other end to a supply reel to a pay out through a wire feed bore disposed through the tool at an angle to the longitudinal axis of the tool, the wire remaining in a vertical plane containing the longitudinal and wire bore axes of the tool, thereby enabling the machine to translate the tool in that plane to position the wire above a second bond site on a workpiece, without twisting the wire.

Another object of the invention is to provide an ultrasonic wire bonding machine which includes a cascaded stack of orthogonally translatable support platforms that support an orbital bonding head, the latter supporting a bonding tool, the machine including means for effecting translation motions of the support platforms, and rotation of the orbital bonding head, thereby enabling the ultrasonic bonding tool to be positioned at arbitrary positions within a workspace containing a workpiece, and at arbitrary angular orientations, thus enabling the tip of the bonding tool to be positioned at a first arbitrary bond site location on a workpiece, the tool rotated to align a wire feed bore with a second arbitrary bond site location, and translated thereto to make a second bond, the wire paying out through the wire feed bore without twisting.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends an automatic ultrasonic wire bonding machine which includes an orbital bonding tool support head and automatic means for translating the bonding tool head relative to a workpiece, and independent automatic means for rotating the head, thus enabling a bonding tool tip to form ultrasonic wire bonds at arbitrary locations within a workspace, rotating the tool to desired compass directions, and translating the tool without rotating to a second bond site location. Thus, the ultrasonic wire bonding machine according to the present invention is adapted to bonding wires between arbitrary locations on a workpiece by ultrasonic bonding using a wedge-type ultrasonic bonding tool, without requiring that the workpiece be translated or rotated.

In a preferred embodiment of an automatic ultrasonic bonding machine with orbital bonding tool head according to the present invention, the orbital bonding tool head is supported by a positioning mechanism for translating the bonding tool head, and therefore the tip of an ultrasonic bonding tool, by drive motors to precisely predeterminable positions within a three-dimensional coordinate space containing a workpiece. The positioning mechanism of the wire bonding machine according to the present invention preferably includes a laterally oriented, upper support frame member or gantry, which supports a generally downwardly tiered or cascaded series of linearly translatable support platforms These include a first, upper X-axis tool support platform supported by a first pair of fore-and-aft opposed, front and rear, laterally disposed, parallel linear slide bearings having crossed rollers. This latter pair of bearings enables the Y-axes platform to be translatable in a fore-and-aft Y-axis direction by a Y-axis driver motor.

The first, upper, X-axis tool support platform is translatable in a lateral direction by an X-axis drive motor. The positioning mechanism also includes a second, Y-axis translatable tool support platform which is suspended from the X-axis platform, by a second pair of crossed roller bearings. This pair of bearings consists of two fore-and-aft disposed, laterally opposed parallel linear slide bearings having crossed rollers. This latter pair of bearings enables the Y-axis platform to be translatable in a four-and-aft, Y-axis direction by a Y-axis drive motor.

The positioning mechanism of the wire bonding machine according to the present invention also includes a third, Z-axis support platform which depends downwardly from the Y-axis support platform. The Z-axis support platform is supported from the X-axis platform by a third pair of bearings, consisting of two vertically disposed, fore-and-aft opposed parallel linear slide bearings having crossed rollers. In a preferred embodiment of the machine, the Z-axis support platform bearings are located near front and rear edges of an offset flange plate which depends vertically downwards from a side of the Y-axis supped platform. In an example embodiment, these bearings protrude inwards, i.e., to the right from a flange plate offset to the left side of the Y-axis platform. The Z-axis bearing pair enables the Z-axis platform to be translated in a vertical, Z-axis direction by a Z-axis drive motor.

The orbital bonding head of the automatic ultrasonic wire bonding machine according to the present invention includes a head support assembly which is mounted to a lower front portion of the Z-axis support platform by a cantilever bar which protrudes forward from the Z-axis support platform. The orbital bonding head assembly includes structural components which rotatably support a head that in turn supports an ultrasonic transducer in which is mounted a bonding tool, particularly a wedge bonding tool, and a clamp mechanism for feeding bonding wire through a wire guide bore disposed obliquely through the bonding tool. The orbital bonding tool head includes a four-bar parallelogram linkage support frame which couples an upper portion of the head to the transducer, tool, and wire feed clamp assembly, the four-bar linkage enabling the tool tip to be displaced only vertically in response to a reaction force produced by translating the tool tip downwardly into contact with a workpiece, thus insuring that the tool tip is not displaced laterally and thus avoiding scuffing the workpiece.

Novel features of the orbital bonding tool head include minimization of the weight of rotatable components of the head by locating drive motors for head rotation and clamp actuation rearward of the head, on a non-rotating support arm. Bonding wire is fed to the bonding tool from a supply reel fixed to the Y-axis platform, through a bore concentric with the rotating axis of the head, thus insuring that the bonding wire is not twisted when the head is rotated.

The bonding head is rotatable by an external drive motor coupled by a toothed belt to a spindle-drive sprocket wheel at the upper end of a spindle which supports the head. The head drive motor rotates the head plus and minus 180 degrees, allowing a plane containing the longitudinal axis and wire feed bore axis of the tool to be rotated to any azimuthal direction related to a workpiece.

The orbital head of the bonding machine also includes a clamp actuator drive motor which is coupled to a hollow shaft which fits concentrically inside the head support spindle by a toothed belt which engages a clamp actuator sprocket which is located above the spindle-drive sprocket wheel. Mounted to a lower end of the hollow clamp-drive shaft is a cam wheel which engages a follower coupled by a bell crank assembly to a wire feed clamp, the jaws of which are alternatively openable and closeable onto feed wire in response to pressurization of a pneumatic actuator. Thus, the novel design of the bonding machine according to the present invention enables the wire feed clamp assembly to be operated independently of rotation angle of the head, thereby minimizing the mass of rotating head components by locating the cramp actuator drive motor off of the head.

BRIEF DESCRIPTION OF THE DRAWINGS

FIG. 3A is a rear perspective view of the machine of FIG. 1.

FIG. 4A is an upper plan view of the machine of FIG. 1.

FIG. 5 is a right side elevation view of the machine of FIG. 1.

FIG. 14A is a right side elevation view of the bonding tool head assembly of FIG. 11.

FIG. 26 is a fragmentary upper plan view of the structure of FIG. 25, on a somewhat enlarged scale and showing details of the wire clamp mechanism.

FIG. 27 is a front elevation view of the structure of FIG. 26.

FIG. 28 is a longitudinal sectional view of the structure of FIG. 27, taken along line 28—28.

DESCRIPTION OF THE PREFERRED EMBODIMENTS

FIGS. 1–38 illustrate a gantry mounted ultrasonic wire bonding machine with orbital bonding tool head according to the present invention. The embodiment of the invention shown in the figures includes an underlying support structure for the gantry, which enables the machine to be supported on the upper surface of a structure such as a bench. However, as will be clear from the ensuing description, the novel design and construction of the machine according to the present invention particularly well adapts the machine to be located completely above a plane containing a workpiece, as for example, by being suspended from an overlying support structure and located over a work area of larger lateral extent, e.g., a conveyor.

In preferred embodiments of an ultrasonic wire bonding machine with orbital bonding tool head according to the present invention, an orbital bonding tool head is supported by a vertically downwardly cascaded series of support platforms which are translatable with respect to a workpiece located below the head. Each of the platforms is supported by a separate pair of parallel, spaced apart linear bearing ways in which are fitted crossed cylindrical roller bearings. Each pair of linear bearings is disposed in a particular coordinate direction, e.g., laterally, for an X-axis platform, longitudinally for a Y-axis platform, and vertically for a Z-axis platform, the latter platform in turn supporting an orbital bonding tool head. Moreover, each of the platforms is translatable with respect to an overlying support structure or platform by a separate motor drive mechanism. In a preferred embodiment, the Y-platform and X platform motor drive mechanisms each include a lead screw or jack screw driven by a stepper motor mounted onto a support member, the screw threadingly engaging a follower nut mounted on the translatable platform. Also in the preferred embodiment, the Z-axis motor drive mechanism includes a spiral cam wheel driven by a stepper motor mounted on a support platform, and a roller bearing follower riding on the cam wheel and attached to the Z-axis platform.

Details of the structure and function of the aforementioned bearings and motor drive mechanisms are substantially similar to those described in the present inventor's co-pending U.S. patent application Ser. No. 09/570,196, filed May 12, 2000, for an Automatic Ultrasonic Bonding Machine With Vertically Tiered Orthogonally Translatable Tool Support Platforms, now U.S. Pat. No. 6,382,494. Accordingly, the entire specification of the aforementioned co-pending U.S. patent application is hereby incorporated by reference into the present specification.

Figure 1:
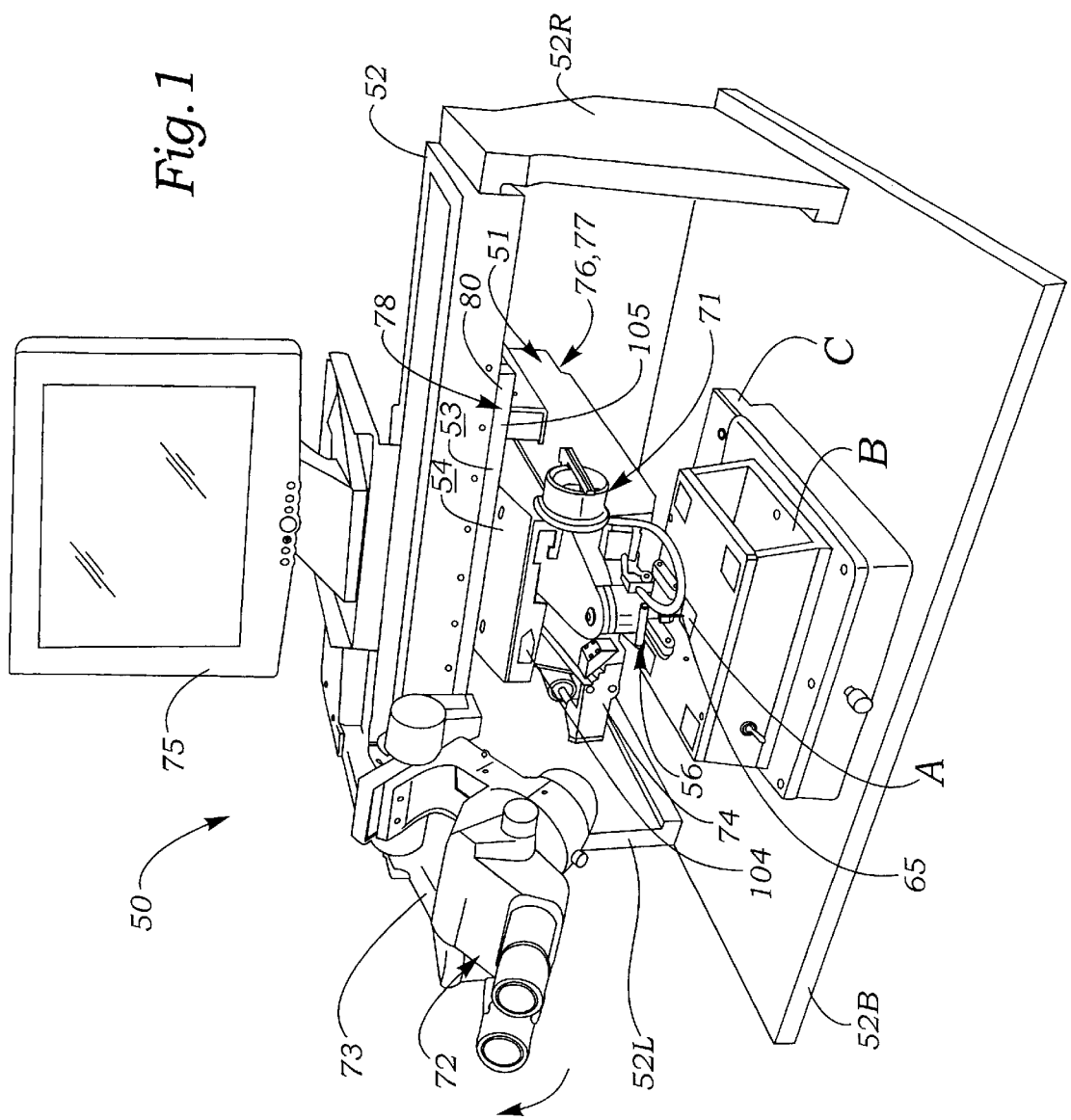
FIG. 1 is a front perspective view of a gantry mounted ultrasonic wire bonding machine with orbital bonding tool head according to the present invention.

Referring now to FIGS. 1–10, a gantry mounted ultrasonic bonding machine 50 according to the present invention may be seen to include a positioning and actuating mechanism indicated generally by the numeral 51. As shown in FIG. 1, machine 50 includes a laterally elongated, generally rectangularly-shaped upper horizontal support member or gantry 52. Gantry 52 may be supported by any suitable means as for example, by support members located above the gantry. However, in the embodiment shown in FIG. 1, gantry 52 is supported by a pair of laterally spaced apart, vertically disposed, parallel support walls 52L, 52R which depend perpendicularly upwards from a base plate 52B, and which are fastened to the underside of the gantry. This arrangement enables bonding machine 50 to be used in bench-top applications.

Referring still to FIGS. 1–10, it may be seen that bonding machine 50 includes a first, upper X-axis support platform 53 laterally translatably mounted to the underside of gantry 52, and a second, Y-axis platform 54 mounted to the underside of the X-axis support platform in a manner permitting longitudinal, i.e., fore-and-aft, translation of the Y-axis platform relative to the X-axis platform. As may be seen best by referring to FIGS. 6 and 7, bonding machine 50 includes a third, Z-axis platform 55 vertically translatably mounted to the right side of a flange plate 136 which depends vertically downwardly from the Y-axis platform 54 near the left edge wall of the Y-axis platform. Also, as may be seen best by referring to FIGS. 12–14 in addition to FIGS. 6 and 7, bonding machine 50 includes an orbital bonding head 56. The latter is supported near the forward end of an orbital bonding tool head support assembly 57 which includes a rearwardly protruding cantilever support beam 58 that is attached near a rear end portion thereof to Z-axis platform 54.

Figure 29:
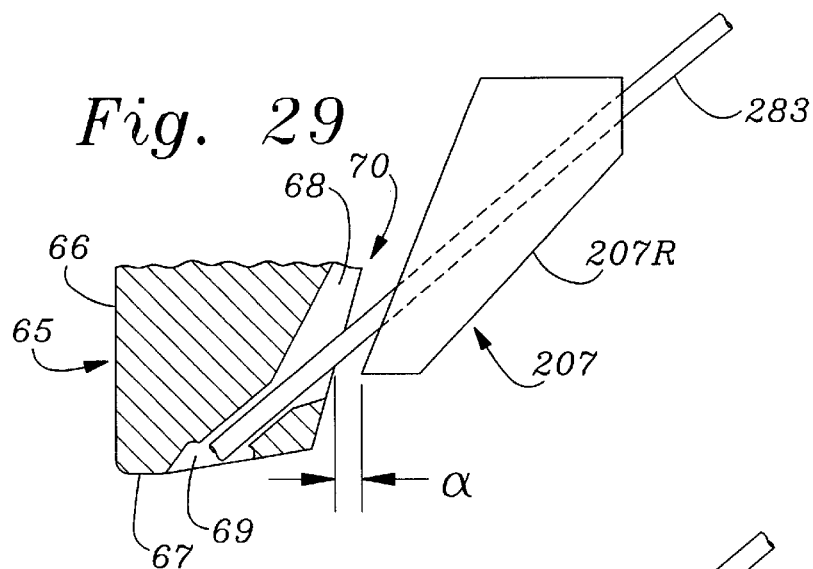
FIG. 29 is a fragmentary and partly schematic longitudinal sectional view of the article of FIG. 25, on an enlarged scale and showing a length of bonding wire disposed between jaw clamp blade and into a wire feed bore in a bonding tool.
Figure 30:
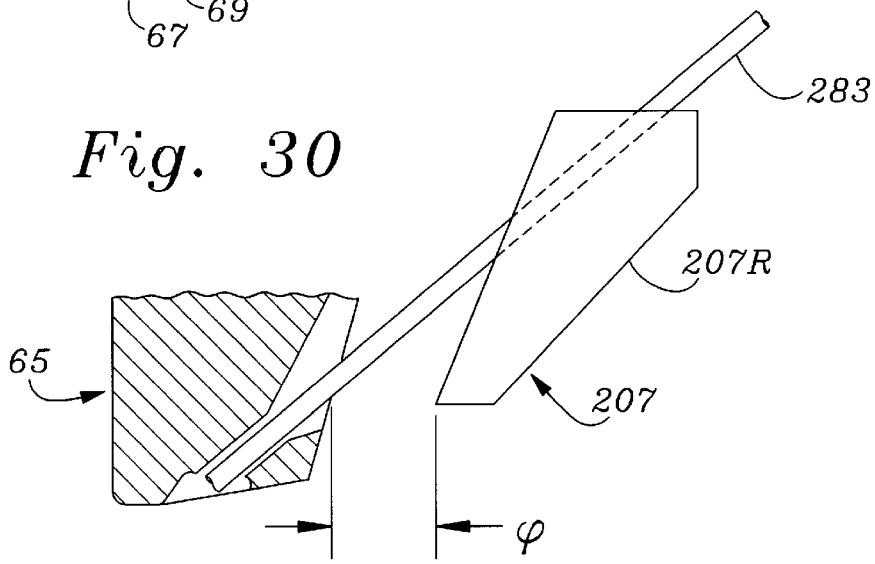
FIG. 30 is a view similar to that of FIG. 29, but showing the wire feed clamp blades closed to clamp on a wire preparatory to feeding it forward, and showing the wire feed clamp beginning to push wire through the wire feed bore of the bonding tool.
Figure 31:
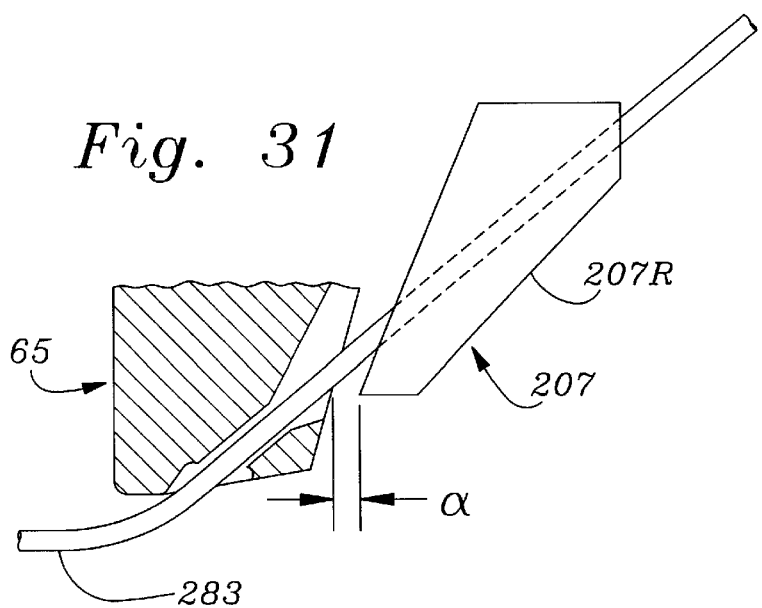
FIG. 31 is a view similar to that of FIG. 30, but showing the clamp moved forward to thus push the wire through the front exit opening of the bonding tool.
Figure 32:
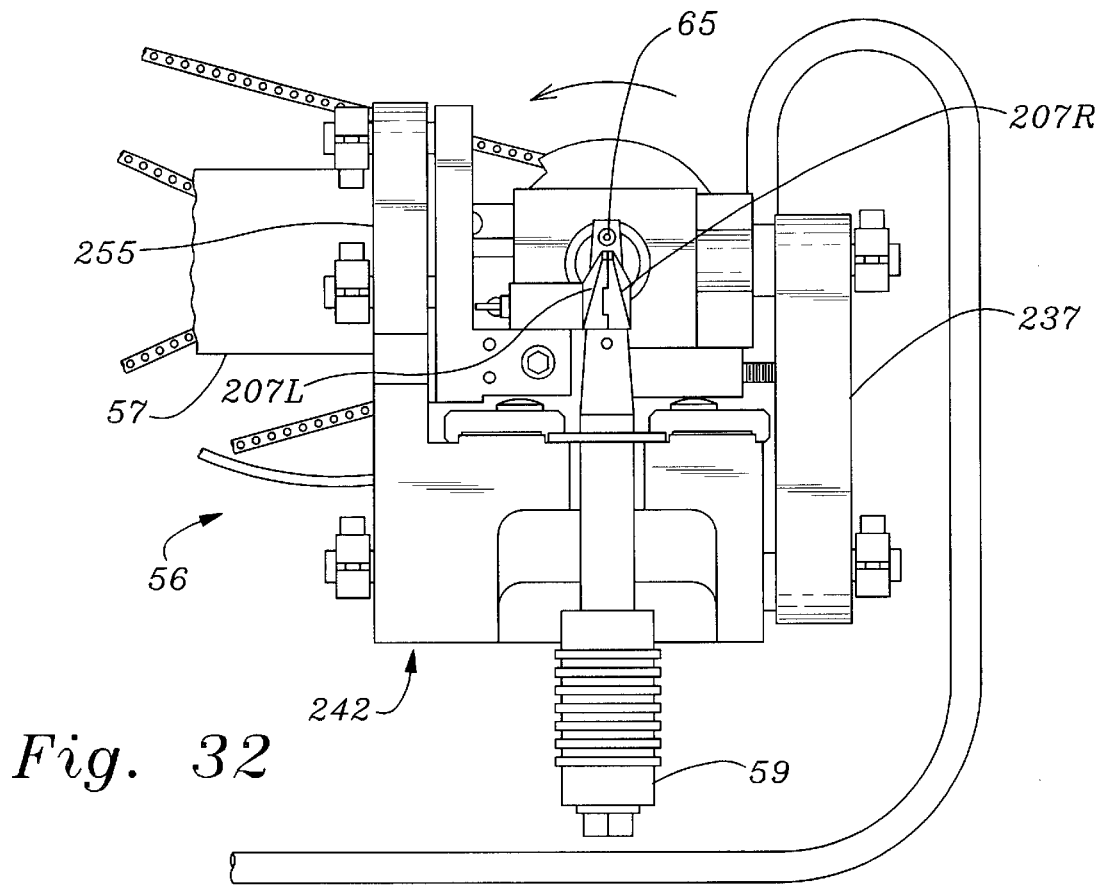
FIG. 32 is a fragmentary lower plan view of the bonding tool head of FIG. 11, similar to that of FIG. 15, but showing the head orbited 90 degrees clockwise as viewed from above, i.e., 90 degrees counterclockwise in FIG. 32.
Figure 33:
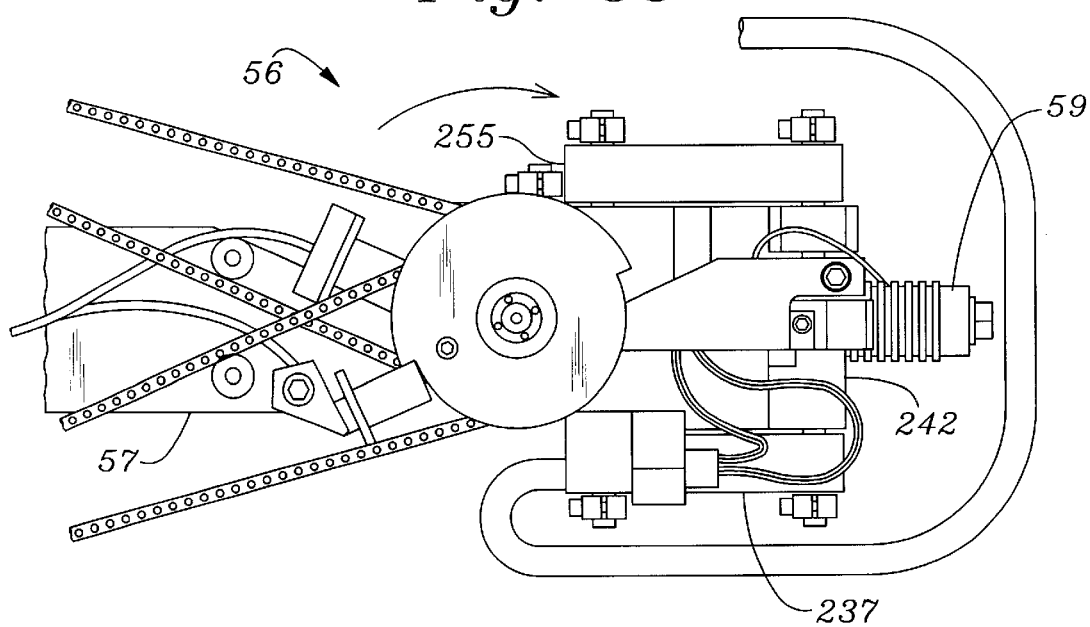
FIG. 33 is a fragmentary upper plan view showing the head orbited an additional 90 degrees for a total of 180 degrees clockwise from its position in FIG. 16 and viewed from above.
Figure 34:
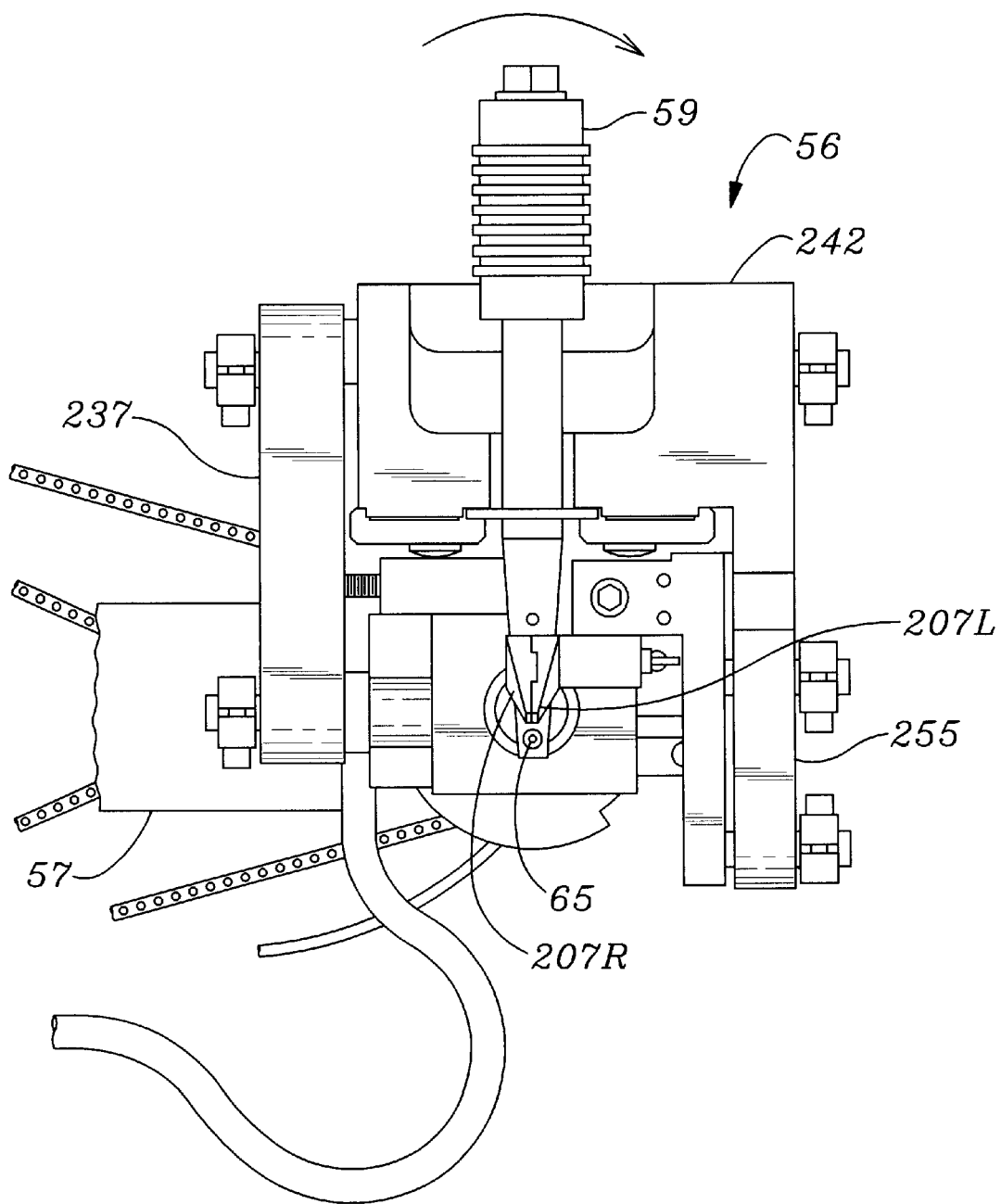
FIG. 34 is a lower plan view of the bonding head of FIG. 11, showing the head orbited 90 degrees counterclockwise as viewed from below, i.e., to a position 270 degrees clockwise from the position shown in FIG. 16, as viewed from above.

As shown in FIGS. 1, 6, and 11–15, bonding machine 50 includes an ultrasonic transducer 59 mounted to the underside of an ultrasonic transducer support assembly 60 which depends downwardly from the underside of orbital bonding head 56, near the front end portion thereof. As shown in FIGS. 11–15, ultrasonic transducer 59 has a longitudinally elongated, generally cylindrically-shaped body 61, which has a radially inwardly and forwardly tapered front portion 62. Front portion 62 of transducer 59 has therethrough near front face 63 thereof a vertically disposed bore 64 which holds therein a vertically disposed ultrasonic bonding tool 65. As may be seen best by referring to FIG. 24 in addition to FIGS. 12 and 14, bonding tool 65 is a wedge-type bonding tool, having a generally cylindrically-shaped upper shank portion 66, and a generally flat lower working surface or foot 67. As shown in FIG. 29, tool 65 also has therethrough a diagonally disposed wire guide bore 68 which angles rearwardly and upwardly from a front exit opening 69 in foot 67 to a rear entrance opening 70 in shank 66. Bonding wire payed out from a wire supply reel 71 mounted on Y-axis platform 54 and fed through rear entrance opening 70, wire guide bore 68, and front exit opening 69 is pressed against a bonding site by foot 67 of bonding tool 65, and vibrated at an ultrasonic frequency to ultrasonically weld the end wire to a workpiece surface.

Referring now to FIGS. 1, 2, 4–5, and 9–10, it may be seen that automatic gantry mounted ultrasonic bonding machine with orbital bonding tool head 50 preferably includes a stereoscopic microscope 72 which enables a human operator to view a workpiece, as for example a workpiece A supported by a pedestal B on table C or conveyor. In a preferred embodiment, microscope 72 is mounted on one end of an articulating arm 73, the other end of which is attached to gantry 52 near a lateral end thereof, e.g., the left end as shown in the figures. This arrangement enables microscope 72 to be swung to the left of gantry 52, allowing free access to a workspace containing workpiece A.

Bonding machine 50 also preferably includes a television camera 74 for forming an electronic image of a workpiece area viewed by the camera, and a monitor 75 connected to the camera for displaying a visual image of the camera field to an operator. Ultrasonic bonding machine 50 also preferably includes a computer (not shown) which contains pattern recognition software effective in processing electronic images of a workpiece formed by camera 74, and issuing command signals to positioning and actuating components of the machine which cause the bonding tool to make ultrasonic bonds at pre-determined locations of a workpiece referenced to initial sightings of reference features of a workpiece viewed on monitor 75 by an operator. Monitor 75 is also preferably operably interonnected with the computer (not shown) to provide a graphic user interface with the computer which facilitates operation of the machine. The use of a computer and pattern recognition software to position a machine component at pre-determined positions relative to a workpiece is a well-known expedient employed in many automatic manufacturing operations, is well understood by those skilled in the art, and therefore will not be described in detail in this specification.

Referring now to FIGS. 1–10, it may be seen that positioning and actuating mechanisms 51 includes a positioning mechanism indicated generally by the numeral 78, which includes structural components suspended from gantry 52. A primary function of positioning mechanism 76 is to translate bonding tool tip 67 of bonding tool 65 in a three-dimensional coordinate space containing a workpiece to pre-determined points, e.g., sites on the workpiece where ultrasonic bonds are to be made by the machine. An example application of machine 50 is shown in FIG. 1, in which tool 65 is used to make bonds on workpiece A supported by a pedestal B on table C. Positioning and actuating mechanism 76 also includes individual actuator mechanisms indicated generally by the numeral 77 which are attached to orbital bonding tool head 56, and which are described in detail below.

Figure 2:
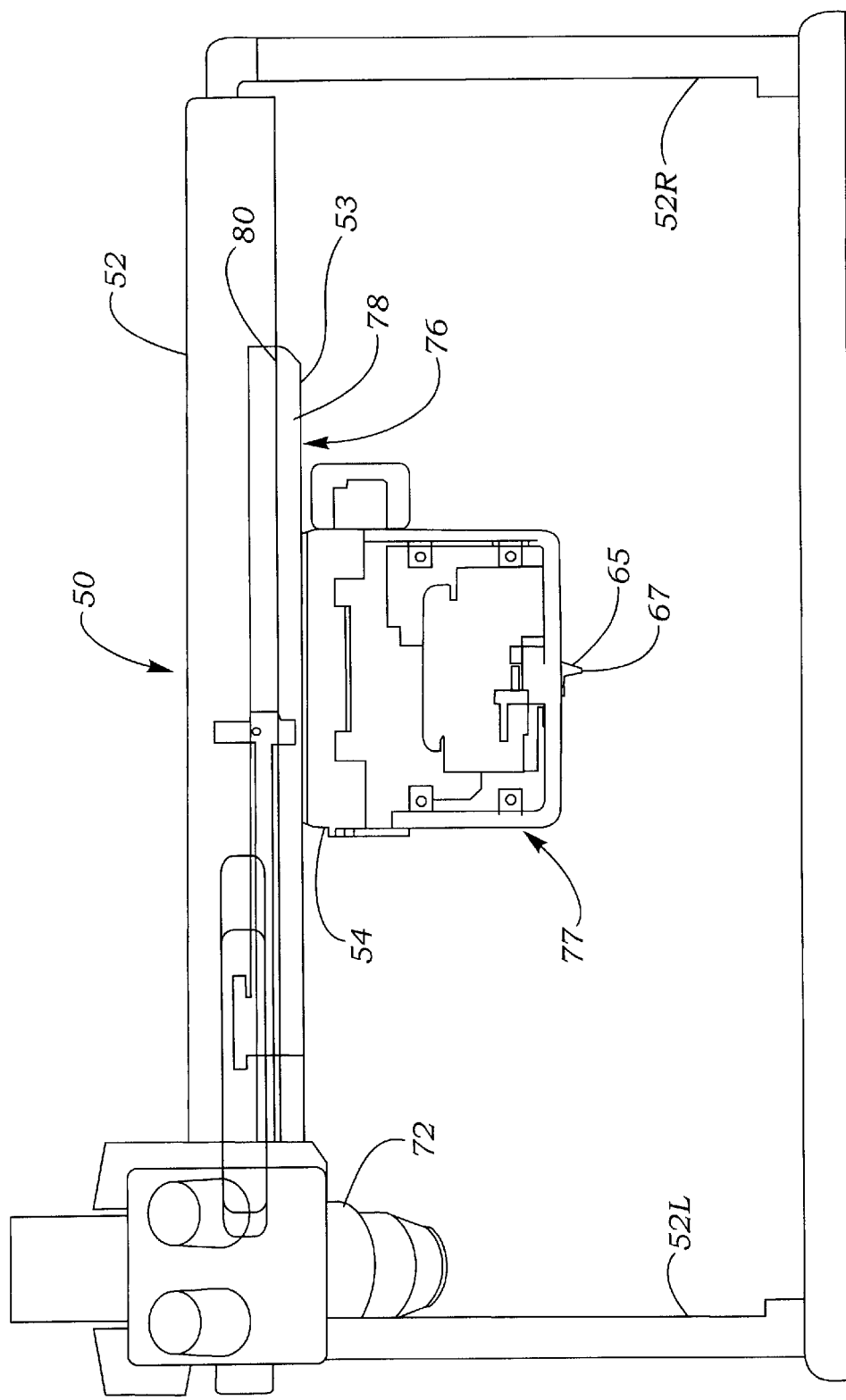
FIG. 2 is a front elevation view of the machine of FIG. 1.
Figure 3B:
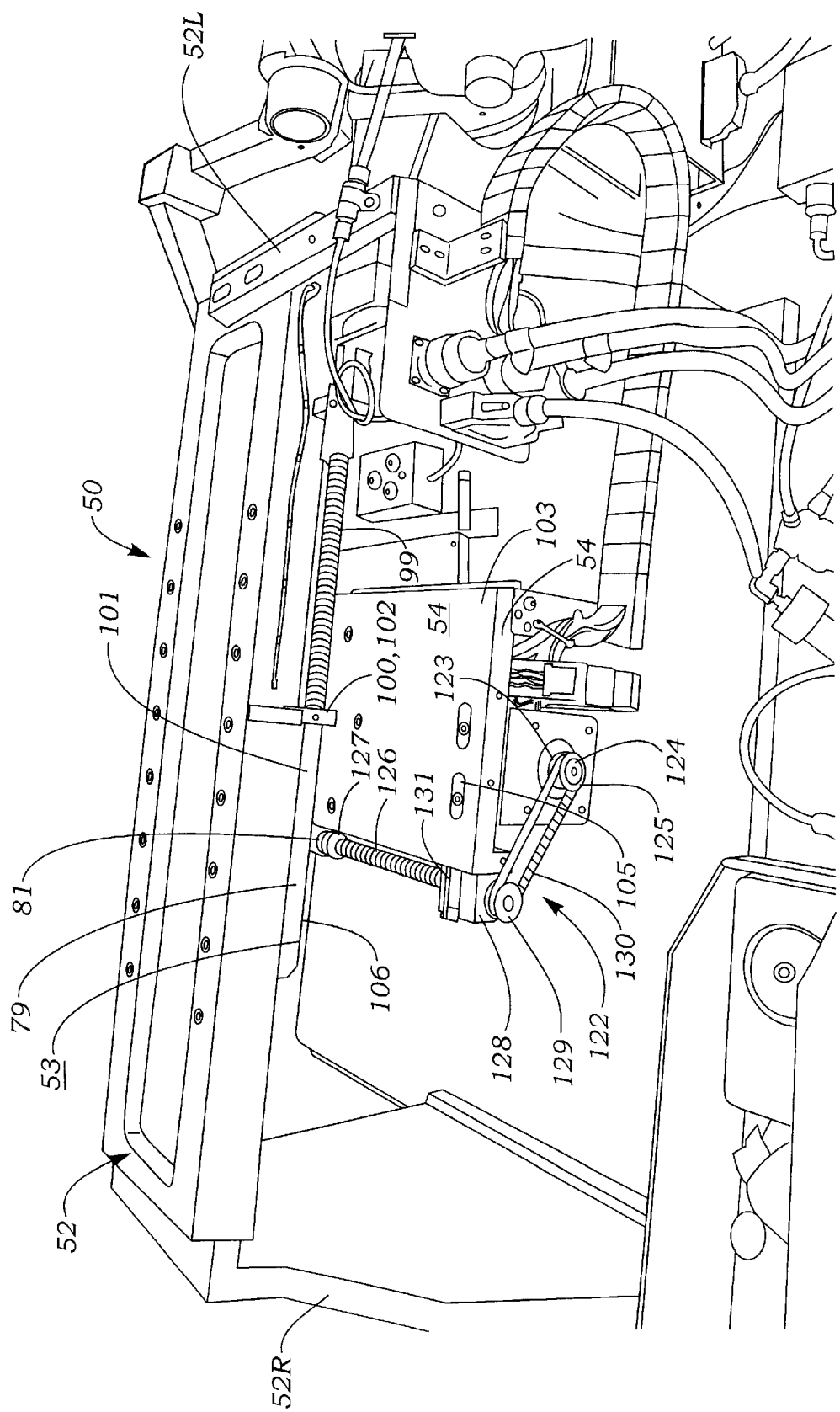
FIG. 3B is a fragmentary rear perspective view similar to that of FIG. 3A, but on a somewhat enlarged scale and showing cover plates thereof removed to reveal details of the machine.

Referring now to FIGS. 3B and 4A, it may be seen that first, upper X-axis tool support platform 53 of bonding machine 50 is rollably translatably mounted to the underside of gantry 52. As shown in FIGS. 1, 3B and 4A, gantry 52 has in upper plan view the shape of a laterally elongated rectangularly shaped plate. As is also shown in FIGS. 2, 3B and 4A, X-axis tool support platform 53 has protruding upwardly therefrom, near front and rear laterally disposed vertical edge walls 78, 79, front and rear linear bearing ways 80 and 81, respectively. Each of the two outer facing laterally disposed vertical walls (not shown) of bearing ways 80 and 81 has formed therein laterally disposed, generally V-shaped bearing groove (not shown), the sides of which groove are perpendicular to one another.

As may be seen best by referring to FIG. 4A, gantry 52 has protruding downwardly therefrom, near front and rear laterally disposed vertical edge walls 86 and 87 thereof, a pair of front and rear linear bearing ways 86A, 87A (not shown). Each of the two inner facing, laterally disposed vertical wails (not shown) of front and rear Z-axis gantry bearing ways (not shown) has formed therein a laterally disposed, generally V-shaped baring groove (not shown), me sides of which groove are perpendicular to one another. The fore-and-aft or longitudinal spacing between outer vertical wall surfaces (not shown) of bearing ways (not shown) protruding upwardly from X-axis platform 53 is slightly less than the longitudinal spacing between the inner facing vertical walls (not shown) of front and rear gantry bearing ways (not shown), which protrude downwardly from gantry 52, enabling the lower, X-axis platform bearing way pair to be received in the longitudinal space between the upper gantry bearing way pair in parallel alignment therewith. Thus positioned, a V-shaped groove (not shown) if the front surface 82 of a front linear Y-axis platform 54 is laterally aligned with an adjacent V-shaped groove (not shown) in rear surface 92 of a front linear gantry bearing way (not shown), forming therewith a front laterally disposed composite X-axis bearing way (not shown) having a generally rectangularly-shaped cross section. Similarly, grooves (not shown) in rear X-axis platform bearing way 81 and rear gantry bearing way (not shown) form a rear laterally deposed composite X-axis bearing way (not shown). Each of the aforementioned composite bearing ways holds a laterally disposed row of laterally spaced apart, cylindrical roller bearings (not shown) held in a laterally elongated roller bearing cage (not shown). Roller bearings (not shown) are right circular cylinders each having a diameter equal to its height. The orientation of the axes of the cylinders alternate, with the axis of each cylinder being perpendicular to that of an adjacent cylinder. This arrangement of bearings enables translation of X-axis platform 53 in a lateral or X-axis direction with respect to gantry 52, with a minimum of static and rolling friction, and a minimum degree of fore-and-aft, i.e., longitudinal run-out.

Figure 4B:
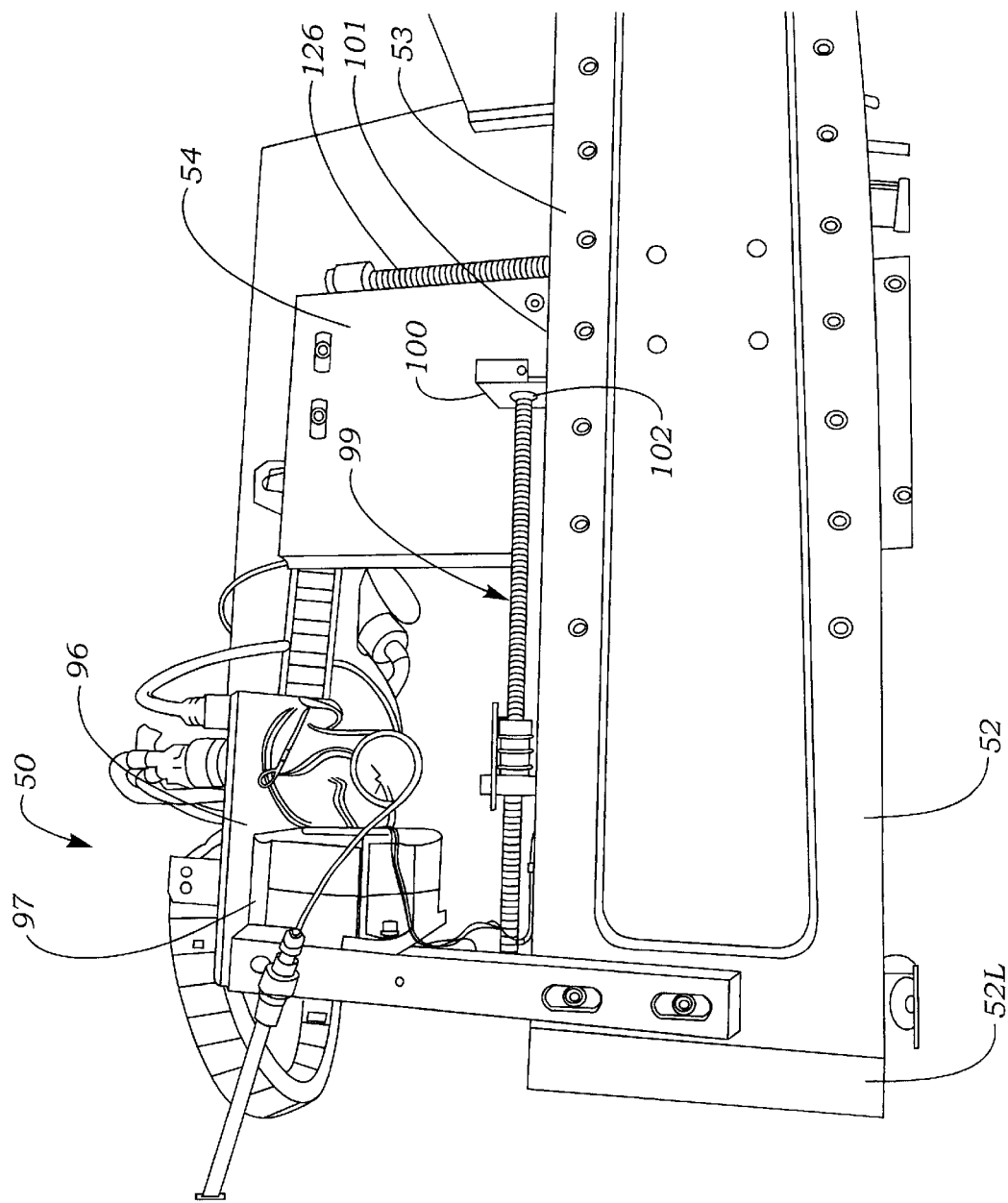
FIG. 4B is a fragmentary upper perspective view of the machine of FIG. 1.

Machine 50 includes a drive mechanism which utilizes a drive motor to translate X-axis platform 53 relative to gantry 52 under computer control. Thus, as shown in FIGS. 3B, 4A and 4B, machine 50 includes an X-axis drive mechanism 96 which includes an X-axis stepper motor 97 mounted to gantry 52 and having a rotatable output shaft 98 coupled to an X-axis lead screw 99 coaxial with the output shaft. X-axis drive mechanism 96 also includes a drive block 100 which protrudes rearwardly from a rear face wall 101 of X-axis platform 53. Drive block 100 has through its thickness dimension a laterally disposed threaded bore 102 which threadingly receives X-axis lead screw by. Thus, when X-axis stepper motor 97 is electrically energized to rotate lead screw 99 in a first rotation direction about it longitudinal axis, drive block 100 and X-axis platform 53 are extended laterally relative to gantry 52 in a first direction, and retracted when the drive motor rotation direction is reversed.

Referring to FIGS. 1–6, it may be seen that second, Y-axis tool support platform 54 of bonding machine 50 is rollably translatably mounted to the underside of X-axis tool support platform 53, in a manner which will now be described.

Figure 6:
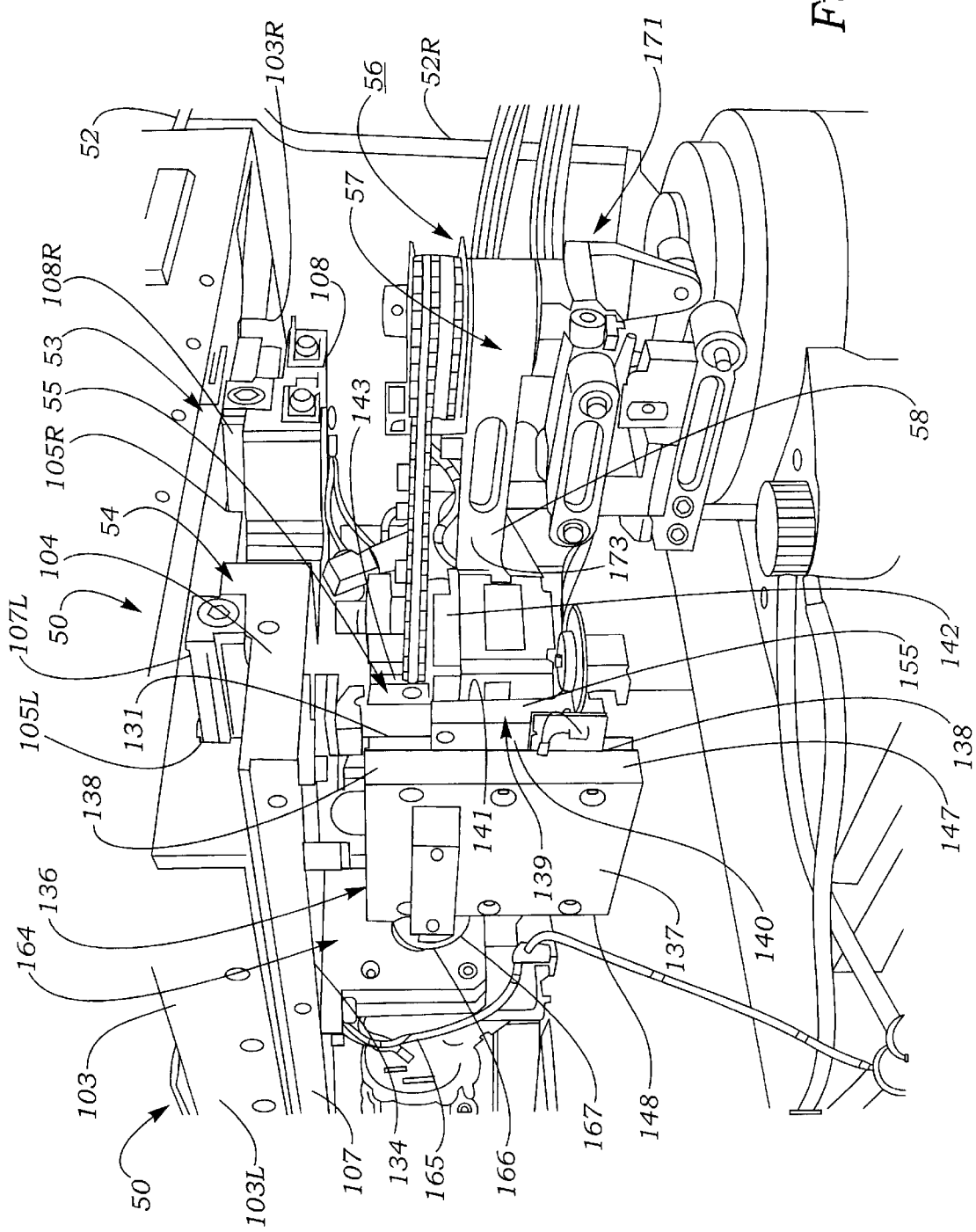
FIG. 6 is a fragmentary lower left perspective view of the machine of FIG. 1 on an enlarged scale.
Figure 7:
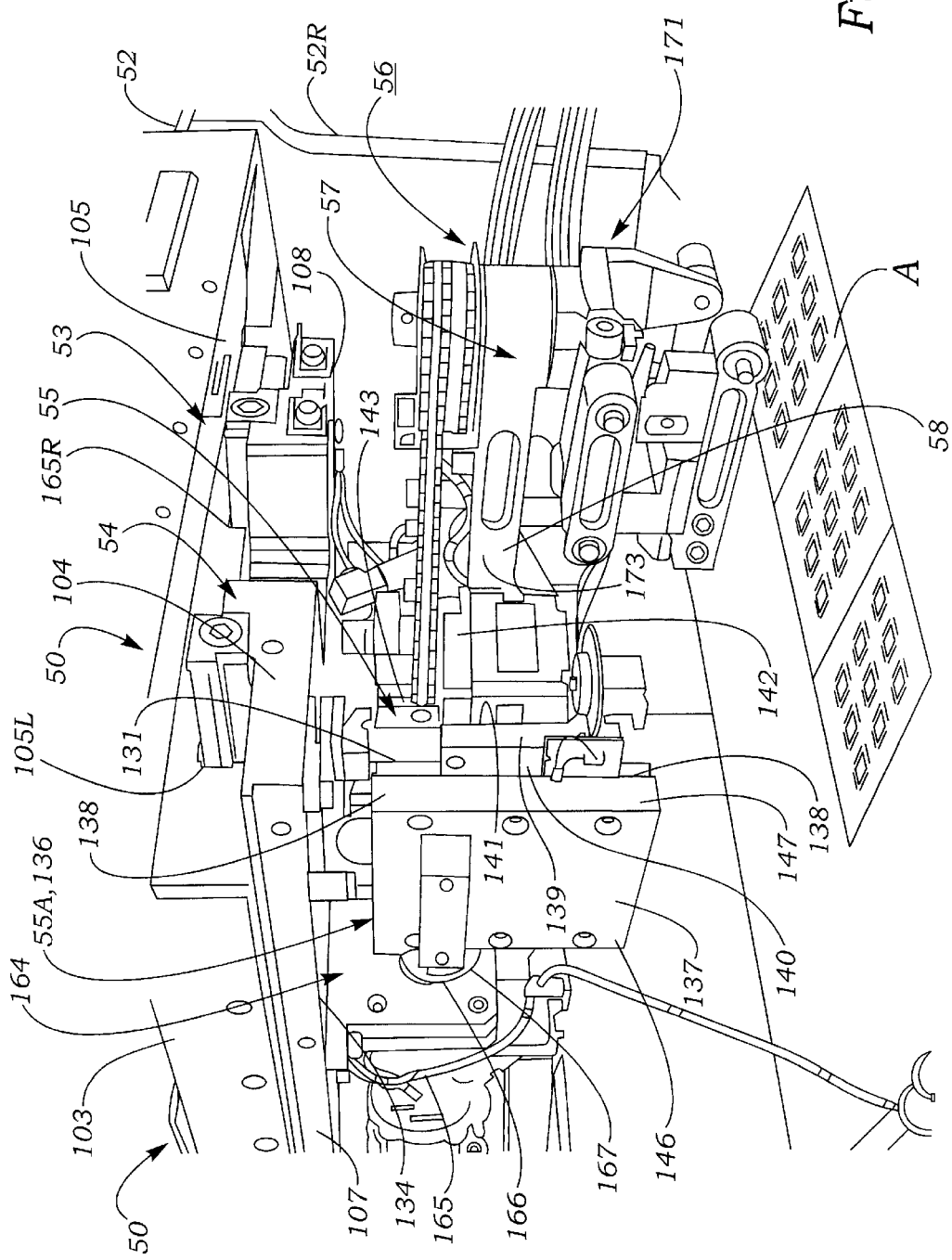
FIG. 7 is a view similar to that of FIG. 6, but on a further enlarged scale.

As shown in FIGS. 4A, 6 and 7, X-axis tool support platform 53 has a laterally elongated, generally rectangular shape which conformally underlies gantry 52. Fastened to the underside of X-axis tool support platform 53 is a longitudinally elongated, generally rectangularly-shaped, horizontally disposed Y-axis support plate 103. Y-axis support plate has a laterally disposed, vertical front face 104 which is parallel to front vertical face 105 of X-axis platform 53. As shown in FIG. 4A, Y-axis support plate 103 protrudes rearwardly of X-axis platform, having a rear vertical face 105 located rearward of rear vertical face 106 of X-axis platform 53.

As shown in FIGS. 6 and 7, Y-axis tool support platform 54 has protruding upwardly therefrom, laterally inwards of left and right longitudinally disposed side walls 107 and 108 thereof, a pair of left and right laterally opposed, longitudinally disposed left and right bearing ways 107L, 108R. Each of the two laterally outwardly located vertical walls (not shown) of bearing ways (not shown) has formed therein a longitudinally disposed, generally V-shaped bearing groove (not shown), respectively, the sides of which grooves ate perpendicular to one another.

Referring still to FIGS. 1 and 3, it may be seen that Y-axis support plate 103 has protruding downwardly therefrom, laterally inwardly located from left and right longitudinally disposed vertical edge walls 103L, 103R thereof, a pair of left and right laterally opposed, longitudinally disposed left and right bearing ways 105L, 105R. Each of the two inner facing vertical walls (not shown) of the Y-axis support plate bearing ways has formed therein a longitudinally disposed, generally V-shaped bearing groove (not shown), the sides of which groove are perpendicular to one another.

The lateral spacing between outer vertical wall surfaces (not shown) of left and right Y-axis platform bearing ways 107L, 108R protruding upwardly from Y-axis platform 54 is slightly less than the lateral spacing between the inner facing vertical walls (not shown) of left and right Y-axis support plate bearing ways 105L, 105R which protrude downwardly from Y-axis support plate 103. Thus, with Y-axis tool support platform bearing ways 107L, 108R positioned between Y-axis support plate bearing ways 105L, 105R, composite left and right Y-axis bearing way grooves (not shown) are formed which hold bearings (not shown) in bearing cages (not shown), exactly similar to those described above for X-axis platform 53. This arrangement enables translation of Y-axis platform 54 in fore-and-aft, i.e., longitudinal directions with respect to X-axis platform 53, with a minimum of static and rolling friction, and a minimum degree of lateral run-out.

Machine 50 includes a Y-axis drive mechanism which utilizes a drive motor to translate Y-axis platform 54 relative to X-axis platform 53 under computer control. Thus as shown in FIG. 3B, machine 60 includes a Y-axis drive 122 mechanism which includes a Y-axis stepper motor 123 mounted to Y-axis support plate 103. Y-axis stepper motor 123 has an output shaft 124 which protrudes rearwardly of Y-axis support plate 103, and a toothed drive pulley 125 pinned to the output shaft Y-axis drive mechanism 122 also includes a longitudinally disposed lead screw 126 rotatably mounted in front and rear bearing blocks 127 and 128 which protrude laterally outwardly from the right side of Y-axis support platform 103. Lead screw 126 has pinned to a rear longitudinal end thereof a toothed drive pulley 129 which is driven by stepper motor drive pulley 125 through a toothed drive belt 130 which encircles the two pulleys.

Referring still to FIG. 3, it may be seen that Y-axis drive mechanism 122 includes a drive block 131 which protrudes laterally outwards from Y-axis platform 54. Drive block 131 has through its thickness dimension a longitudinally disposed threaded bore 132 which threadingly receives Y-axis lead screw 126. With this arrangement, when Y-axis stepper motor 123 is electrically energized to rotate lead screw 125 in a first rotation direction, drive block 13 and Y-axis platform 54 are extended longitudinally forwardly of X-axis platform, and retracted rearwardly when the drive motor rotation direction is reversed.

Referring now to FIGS. 6 and 7, it may be seen that third, Z-axis tool support platform 55 of bonding machine 50 is rollably translatably mounted to the underside of Y-axis tool support platform 54, in a manner which will now be described.

As shown in FIGS. 6 and 7, Y-axis tool support platform 54 has protruding perpendicularly downwardly from lower surface 134 thereof, and near left longitudinally disposed vertical edge wall 107 thereof, a Z-axis support flange plate 136. The latter has a generally square outline, and generally vertically disposed flat outer and inner parallel wall surfaces 137, 138, respectively. As may be seen best by referring to FIGS. 8 Z-axis platform 55 includes a longitudinally disposed left-hand vertical plate portion 139 having a generally square outline and generally vertically disposed, parallel outer (left-hand) and inner (right-hand) wall surfaces 140, 141. Z-axis platform 55 also has a laterally disposed front plate portion 142 to which is mounted a forwardly protruding, cantilever support beam 58. Beam 58 comprises part of an orbital binding tool head support assembly 57, which orbitably supports orbital bonding head 56, in a manner described below. Front plate portion 142 of Z-axis platform 55 is disposed laterally inwardly, i.e., to the right in FIGS. 6–8, of left-hand, longitudinally disposed plate portion 139.

Figure 8:
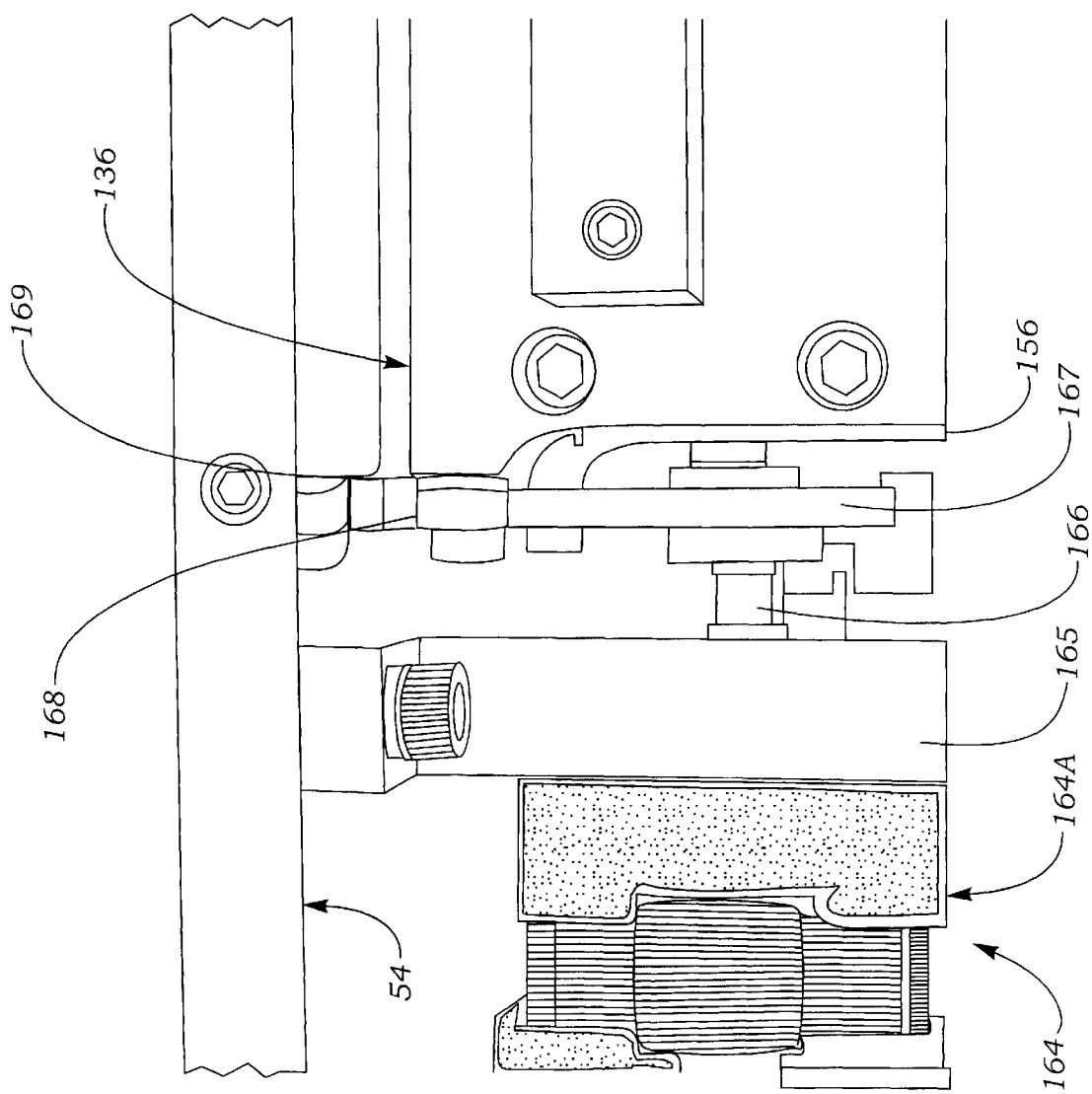
FIG. 8 is a right side elevation view of the structure of FIG. 6, on a further enlarged scale.

As shown in FIGS. 6–8, Z-axis support flange plate 136 has protruding laterally inwardly therefrom, a longitudinally opposed pair of parallel front and rear vertically disposed bearing ways (not shown), located near front and rear vertical edge walls 147, 148, respectively, of the Z-axis platform. Front and rear Z-axis support flange late bearing ways (not shown) have rear and front facing surfaces (not shown), respectively, each of which has formed therein a vertically disposed, generally V-shaped bearing groove (not shown), the sides of each of which grooves are mutually perpendicular.

Referring still to FIGS. 6–8, it may be seen that Z-axis support platform 55 has protruding laterally outwardly (to the left in FIGS. 1–3) a longitudinally opposed pair of front and rear vertical bearing ways (not shown), located inwardly of front and rear vertical edge walls 155, 156, respectively, of the Z-axis support flange plate. Front and rear Z-axis platform bearing ways (not shown), have front and rear surfaces (not shown), each of which has formed therein a vertically disposed, generally V-shaped bearing groove (not shown), the sides of each of which groove are mutually perpendicular.

The longitudinal, i.e., fore-and-aft spacing between outer vertical wall surfaces (not shown) of front and rear Z-axis support platform bearing ways (not shown) protruding laterally outwardly from Z-axis support platform 55 is slightly less than the longitudinal spacing between inner facing vertical walls (not shown) of front and rear Z-axis support flange plate bearing ways not shown which protrude laterally inwardly from Z-axis support flange plate 136. Thus, with Z-axis support platform bearing ways (not shown) positioned between Z-axis support flange plate bearing ways composite front and rear Z-axis bearing way grooves (no shown), are formed which hold bearings (not shown) in bearing cages (not shown), exactly similar to those described above for X-axis platform 53. This arrangement enables translation of Z-axis platform 55 in up-and-down, i.e., plus and minus Z directions with respect to Y-axis platform 54, with a minimum of static and rolling friction, and a minimum degree of fore-and-aft, or longitudinal run-out.

Machine 50 includes a Z-axis drive mechanism which utilizes a drive motor to translate Z-axis platform 55 relative to Y-axis platform 54 upwardly and downwardly in plus Z and minus Z directions, respectively. Thus, as shown in FIG. 8, machine 50 has a Z-axis drive mechanism 164 which includes a Z-axis stepper motor 164A mounted to a Z-axis motor support plate 165 that protrudes perpendicularly downwardly from Y-axis tool support plate 54, rearward of Z-axis support flange plate 136. As shown in FIG. 8, Z-axis stepper motor 164 has an output shaft 166 which protrudes forward of Z-axis motor support plate 165, through a bore [166] (not shown) disposed longitudinally through the motor support plate. Z-axis stepper motor output shaft 166 has pinned thereto near the front end thereof a spiral cam wheel 167 which has a uniform longitudinal thickness and spiral plan view shape.

As may be seen best by referring to FIG. 8, Z-axis drive mechanism 163 also includes a roller bearing follower 168 which protrudes rearwardly from rear edge wall 169 of Z-axis platform 55, in vertical alignment with the longitudinal axis of stepper motor output shaft 165, and in longitudinal alignment with cam wheel 167. With this arrangement, when Z-axis drive stepper motor 164A is energized to rotate cam wheel 167 to an angular position in which the largest radius surface of the cam wheel is vertically above and aligned with motor shaft 166, as shown in FIG. 8, cam follower 168 and Z-axis platform 55 are elevated to their maximum height in a plus-Z direction. Conversely, when stepper motor 164 is energized to rotate cam wheel 167 so that a smaller radius surface of cam wheel i67 is contacted by cam follower 168, the weight of the Z-axis platform and components mounted thereto causes the Z-axis platform to move downwardly, i.e., in a minus-Z direction.

Figure 14B:
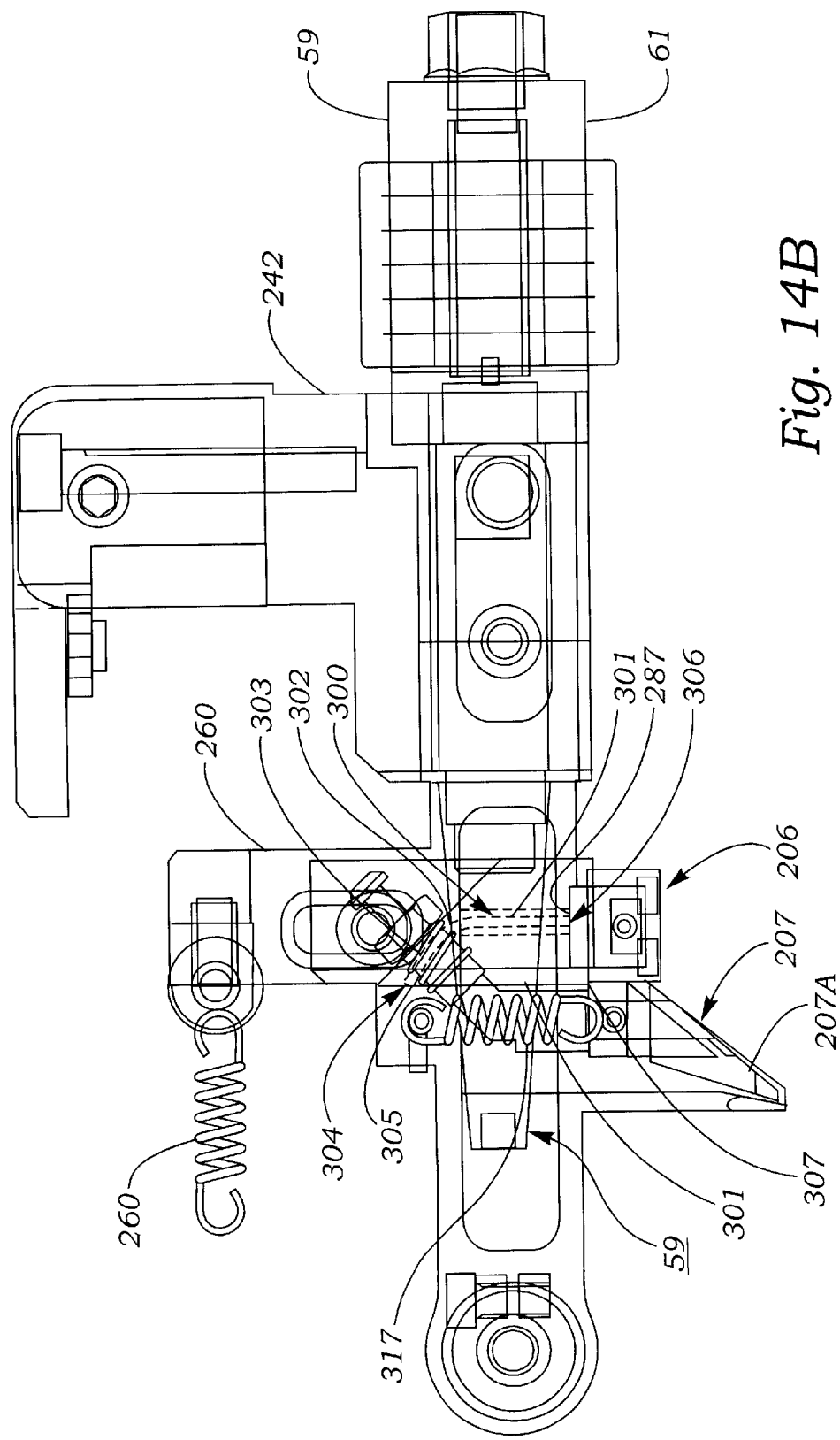
FIG. 14B is a fragmentary view of the structure of FIG. 14A, on an enlarged scale and showing a wire drag tube of the apparatus.
Figure 15:
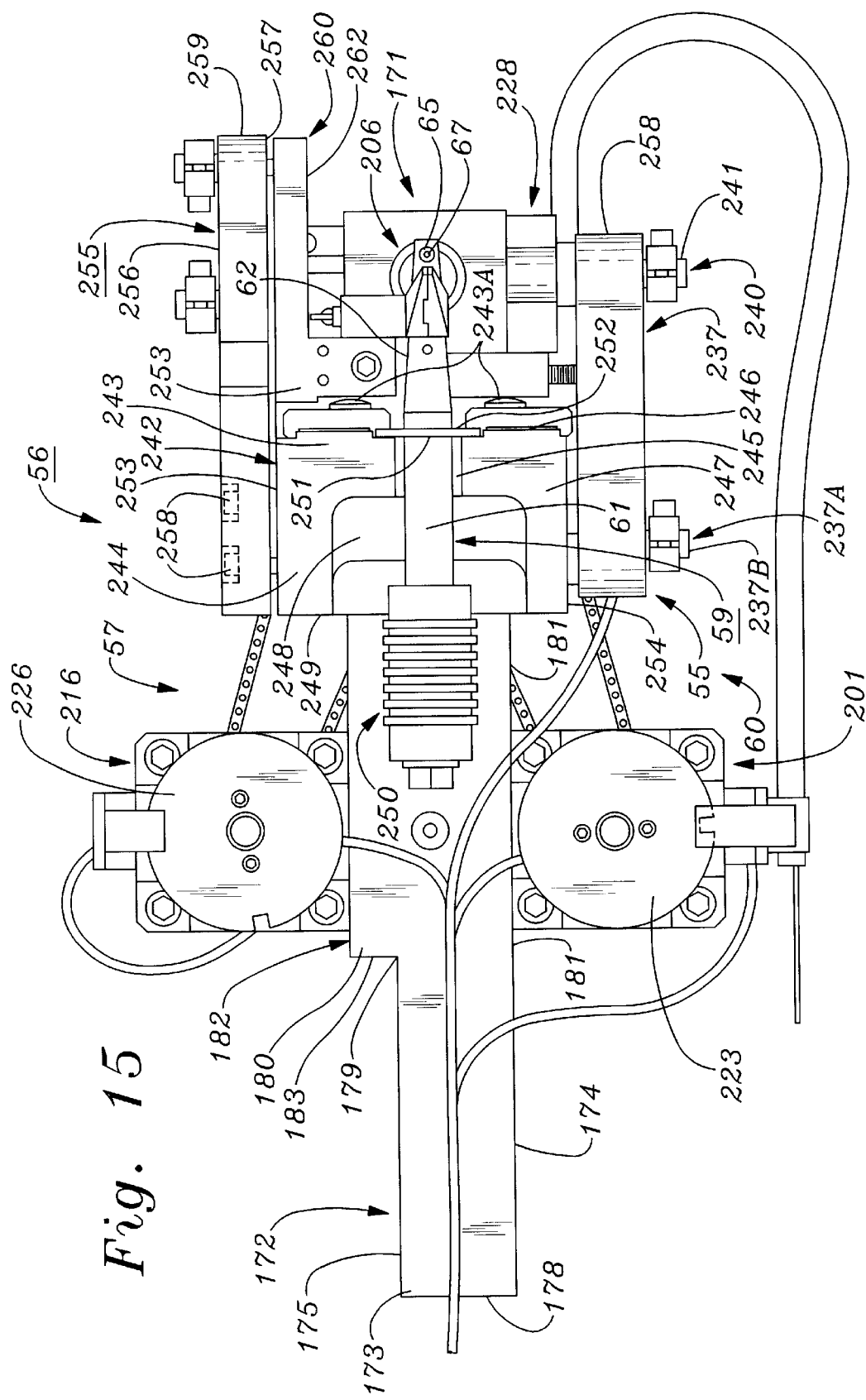
FIG. 15 is a lower plan view of the bonding tool head assembly of FIG. 1.

The novel structure and function of orbital bonding tool head assembly 56 may be best understood by referring to FIGS. 11–37. Referring first to FIG. 6, in addition to FIGS. 11–16, it may be seen that orbital bonding tool head assembly 56 includes a support assembly 57 which has depending downwardly from a front end portion thereof a rotatable bonding tool head 171. As shown in FIGS. 12, 14A and 15, orbital bonding tool head assembly support assembly 57 has a longitudinally elongated cantilever support beam member 58, 172, which includes a rear vertically oriented plate-like portion 173 having parallel, vertical right and left side walls 174, 175, respectively. As shown in FIGS. 5, 6 and 14A, rear plate-like member 173 serves as a fastening plate for cantilever support beam 172 for orbital head support assembly 57, being secured to the right-hand side of a vertical support wall 175A, which protrudes forward from Z-axis platform 55 near the left side thereof, by bolts 176 which pass through holes 177 disposed transversely through the rear plate-like beam member.

Figure 16:
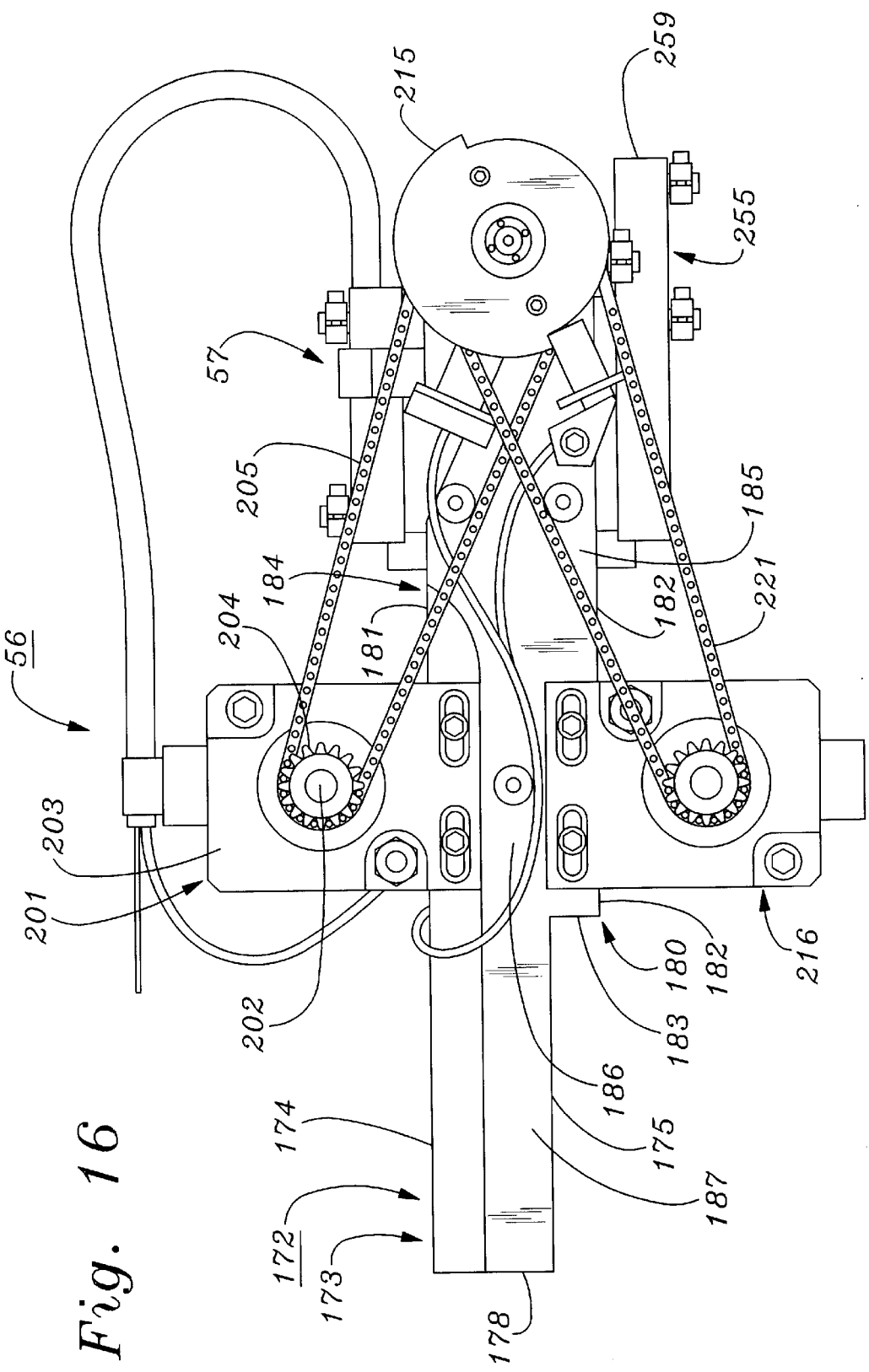
FIG. 16 is an upper plan view of the bonding tool head assembly of FIG. 11.
Figure 17:
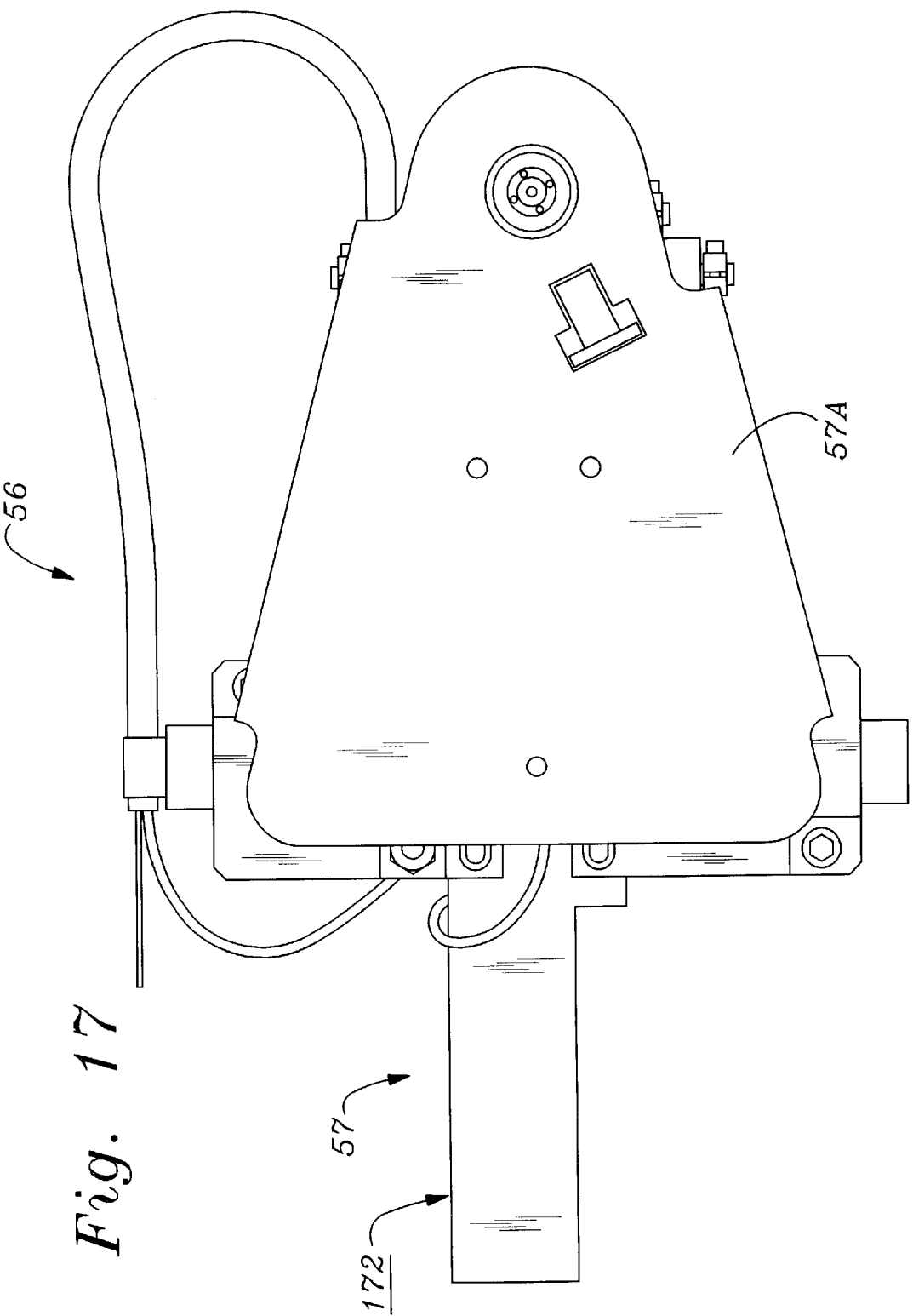
FIG. 17 is a view similar to that of FIG. 16, but showing a cover plate 57a installed.

As may be seen best by referring to FIGS. 12, 15, and 16, rear plate portion 173 of support beam member 172 has a generally flat vertical rear face 178, and is terminated at a front transverse end 179 thereof by a laterally thickened, block-shaped portion 180 which has a generally rectangular shape. Block-shaped portion 180 has one longitudinally disposed vertical face, e.g., a right face 181 which is coextensive with right face 174 of rear plate-like portion 173 of beam 172. Block-shaped portion 180 of support beam member 172 also has a second longitudinally disposed face, e.g., a face 182 left, which is parallel to left vertical face 175 of rear plate portion 173 of beam 172, but offset laterally outwardly, i.e., to the left of the rear left face, being joined thereto by a transversely disposed, vertical abutment face 183.

As may be seen best by referring to FIGS. 12 and 16, support beam member 172 of orbital head support assembly 57 includes a front longitudinally disposed beam member 184 which protrudes perpendicularly forward from front vertical transverse face 185 of block-shaped portion 180 of beam member 172. Front beam member 184 has a horizontal, longitudinally disposed upper face 186 which is coextensive with upper face 187 of block-shaped portion 180 of support beam 172. Moreover, upper face 187 of block-shaped portion 180 is coextensive with upper face 188 of rear vertical plate portion 173 of beam support member 172.

As may be seen best by referring to FIG. 12, front longitudinally disposed beam member 184 is of a generally uniform vertical thickness, less than that of block-shaped portion 180 of support beam member 172. Thus, front longitudinally disposed beam member 184 has a flat, horizontally disposed lower surface 189 parallel to upper surface 186 of the front beam member, which is offset vertically upwards from the lower surface 190 of block-shaped portion 180 of support beam member 172.

Figure 11:
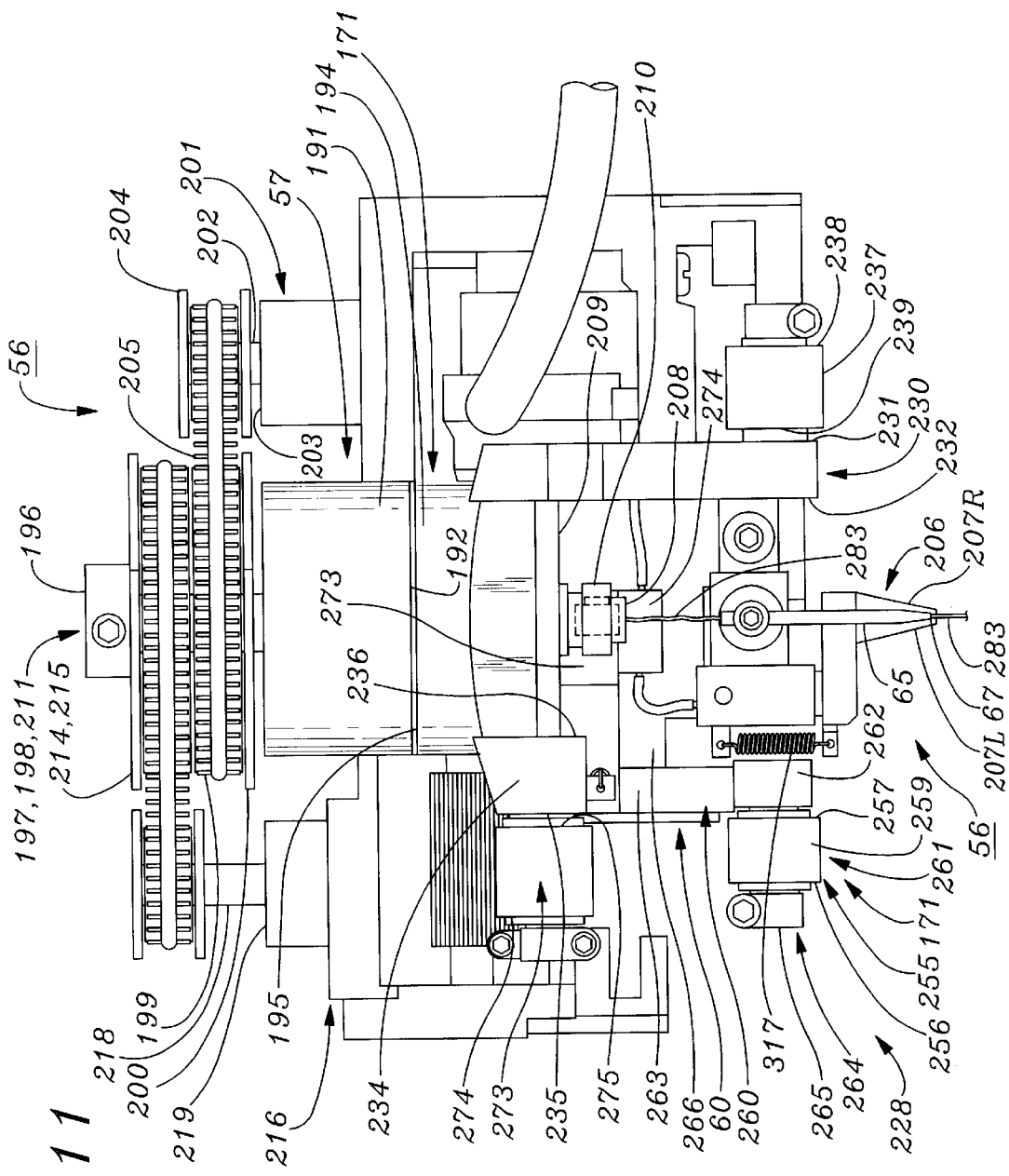
FIG. 11 is a front elevation view of an orbital bonding tool head assembly for the wire bonder of FIG. 1.
Figure 12:
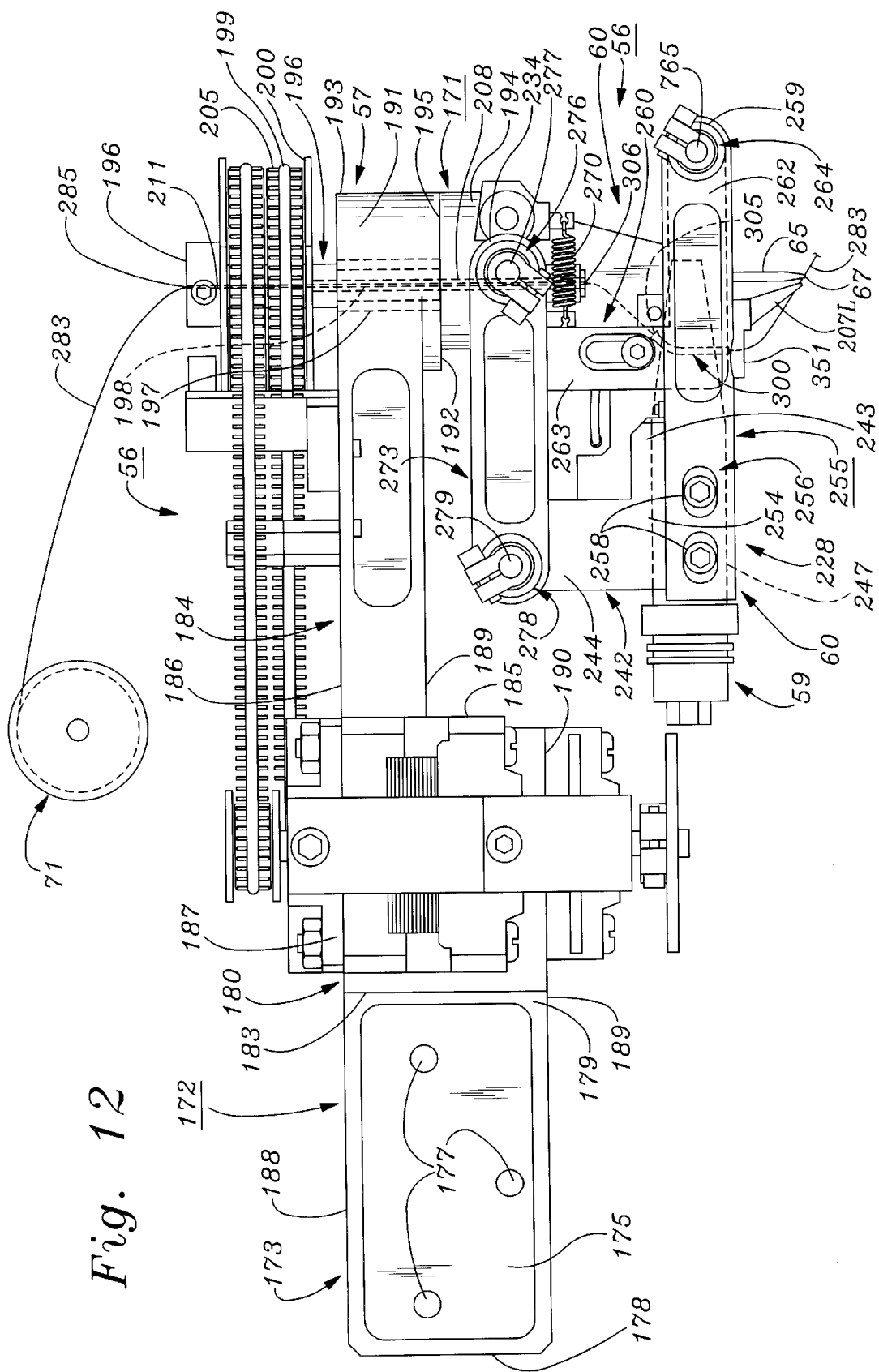
FIG. 12 is a left side elevation view of the bonding tool head assembly of FIG. 11.

As may be seen best by referring to FIGS. 11, 12, and 14A, front longitudinally disposed beam member 184 has formed in the front end portion thereof a generally semi-circular cross section boss 191 which has a flat lower face 192 that is parallel to and offset vertically downwards of lower face 189 of the front longitudinally disposed beam member. Boss 191 has a front vertically disposed, generally circular arc-shaped front face 193 which comprises the front end face of front support beam member 184.

As shown in FIGS. 11, 12, 14A, and 16, orbital bonding tool head 171 of orbital bonding tool head assembly 56 has a generally cylindrically-shaped upper base portion 194 which has a flat, horizontally disposed upper face 195. Upper base portion 194 of bonding tool head 171 is mounted concentrically below boss 191 by a spindle 196 which is rotatably held within a bore 197 disposed vertically through the boss. For reasons which are described below, spindle 196 has a hollow cylindrical shape, having through its length a bore 198.

As shown in FIGS. 11–14A, spindle 196 protrudes upwardly of upper face 186 of front longitudinal beam member 184 through bore 197, and has pinned concentrically thereto a first, lower, spindle-drive toothed pulley 199, and a first lower spindle-drive shaft angle encoder disk 200, located below the pulley. As shown in the same figures, orbital bonding tool head assembly 56 includes a first, spindle-drive stepper motor 201 fastened to right side 174 of central block-shaped portion 180 of upper beam member 172. Spindle-drive stepper motor 201 has a vertically disposed output shaft 202 which protrudes upwardly of upper face 203 of the stepper motor, to which shaft is pinned a toothed drive pulley 204. The latter is coupled to spindle pulley 199 by a first endless flexible toothed, spindle-drive belt 205.

As may be seen best by referring-to FIGS. 26–28, in addition to FIGS. 11–16, orbital bonding tool head assembly includes a wire feed clamp assembly 206 that has a pair of left and right wire clamp jaws 207L, 207R located rearward of ultrasonic bonding tool 65, and means for longitudinally reciprocally translating the clamp fore-and-aft relative to the bonding tool, as will now be described.

As shown in FIGS. 11 and 12, wire feed clamp assembly 206 includes a vertically disposed, hollow drive shaft 208 which is rotatably held within bore 198 which extends axially through head drive spindle 196, concentric therewith. As shown in FIG. 11, head clamp assembly drive shaft 208 protrudes perpendicularly outwardly below lower transverse face wall 209 of upper base support portion 194 of orbital bonding tool head 171.

As may be seen best by referring to FIGS. 20–25 in addition to FIG. 11, a circular cam wheel 210 is eccentrically mounted to that portion of drive shaft 208 which protrudes downwardly from lower face wall 209 of upper base support portion 194 of head 171. As is also shown in those figures, drive shaft 208 has extending through its length a coaxial central wire feed bore 211 which has a lower exit opening 212 located above clamp jaws 207. The function of cam wheel 210 and wire feed bore 211 will be described later.

Figure 13:
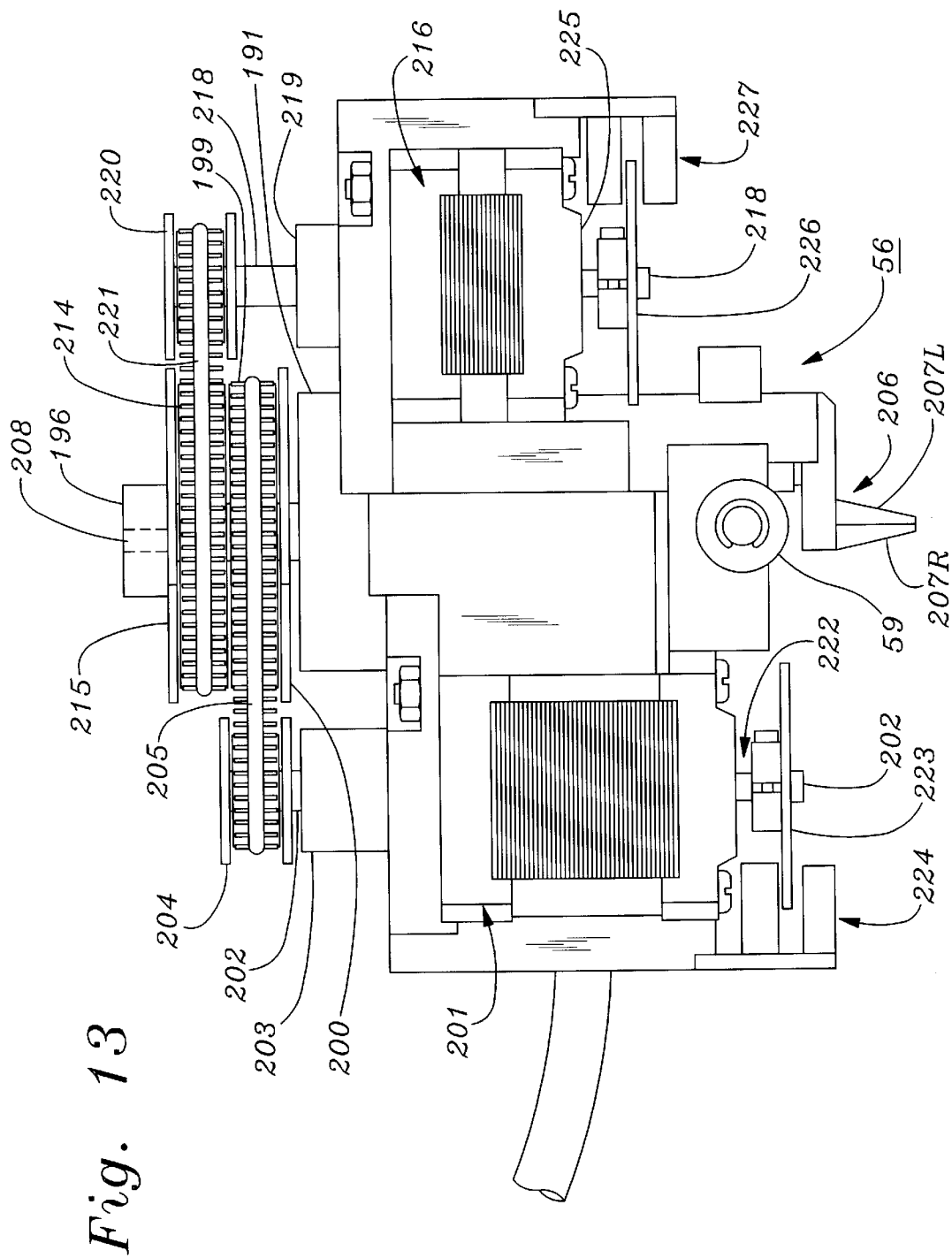
FIG. 13 is a rear elevation view of the bonding tool head assembly of FIG. 11.

FIGS. 11–13 illustrate a mechanism for rotating clamp-drive shaft 208 and cam wheel 210. As shown in FIGS. 11 and 12, clamp-drive shaft 208 protrudes upwardly above first, lower spindle-drive toothed pulley 199, and has pinned thereto a second, upper clamp-drive pulley 214, and a second, upper clamp-drive shaft angle encoder disk 215, located above the pulley. As shown in the figures, the clamp-drive mechanism includes a second, clamp-drive stepper motor 216 fastened to the left side 182 of central block-shaped portion 180 of upper beam member 172. Clamp-drive stepper motor 216 has a vertically disposed output shaft 218 which protrudes upwardly of upper face 219 of the stepper motor, to which shaft is pinned a toothed drive pulley 220. The latter is coupled to clamp-drive pulley 214 by a second endless flexible toothed, clamp-drive belt 221.

As may be seen best by referring to FIG. 13, both spindle-drive stepper motor 201 and clamp-drive stepper motor 216 are provided with shaft angle encoders. Thus, as shown in FIG. 13, a lower end of output shaft 202 of spindle-drive stepper motor 201 protrudes below lower end plate 222 of the drive motor, to which protruding shaft end is pinned a spindle-drive motor shaft angle encoder disk 223. An outer edge of encoder disk 223 is rotatable within a slot provided in an optical pick-off assembly 224, which contains a light source such as an LED and a photodetector such as a photo-transistor, for providing electrical signals when the disk is rotated to positions which allow light to pass through encoding apertures provided through the disk and impinge on the photodetector. Similarly, clamp-drive stepper motor 216 has a lower output shaft end 218 which protrudes below lower end plate 225 of the drive motor, to which protruding shaft end is pinned a clamp-drive motor shaft angle encoder disk 226. An outer edge of encoder disk 226 is rotatable within a slot provided in optical pick-off assembly 227, which contains a light source such as an LED and a photodetector such as a photo-transistor, to provide electrical signals when the disk is rotated to positions which allow light to pass through encoding apertures provided through the disk and impinge on the photodetector.

Machine 50 according to the present invention includes a novel linkage assembly which suspends transducer mount assembly 60 from cylindrical upper base portion 194 of bonding tool head 171. As will be described in detail below, the novel linkage assembly enables orbital bonding tool head assembly 56 to be translated vertically downwards toward a workpiece and thereby cause tip 67 of ultrasonic bonding tool 65 to contact the workpiece, in a manner which enables the tool tip to move resiliently upwards relative to the bonding tool head in response to downwardly directed bonding forces exerted by the tool on the workpiece. As shown in FIGS. 35–38, the novel design and construction of linkage assembly 228 also positions wire feed bore 211 and the axis of bonding tool 65 collinearly with the rotation axis of head-drive spindle 196 thus allowing the head to be orbited to any angle without twisting bonding wire, yet still constraining the bonding tool tip to move resiliently and solely in a vertical direction in response to bonding forces, and thereby preventing the tool tip from scuffing a bonding site. Moreover, the novel design and construction of linkage assembly 228 enables wire feed clamp assembly 206 to function properly for any vertical displacement of the bonding tool tip relative to the bonding head.

Referring now to FIGS. 11–14A and 35–38, bonding tool head 171 of ultrasonic bonding machine 50 may be seen to include a linkage assembly 228 which supports ultrasonic transducer 59 from upper support base 194 of the bonding tool head. As may be seen best by referring to FIGS. 11 and 14A, upper support base 194 has protruding from the right side 229 thereof a downwardly depending, relatively large, wedge-shaped right-hand support plate 230 having parallel vertically disposed right (outer) and left (inner) faces 231, 232, respectively. Right-hand support plate 230 has a relatively wide upper end, which tapers downwardly to a lower end having less longitudinal width.

As shown in FIGS. 11 and 12, upper support base 194 has protruding from the left side 233 thereof a downwardly depending, relatively short left support plate 234 which has parallel vertically disposed left (outer) and right (inner) faces 235, 236, respectively.

Figure 35:
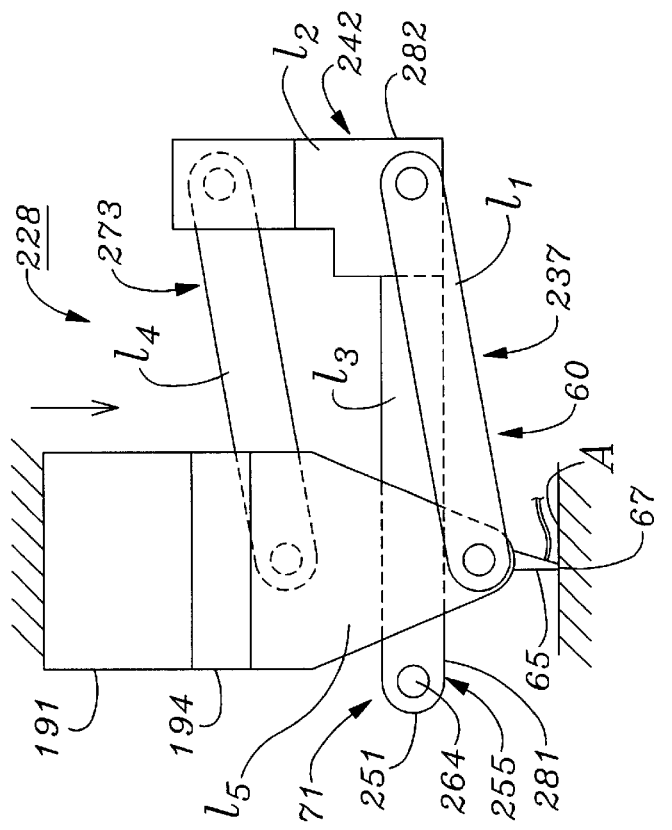
FIG. 35 is a partly schematic, right-hand view of the orbital bonding tool head of FIG. 11, showing elements of a linkage mechanism thereof.

As shown in FIGS. 11, 14A, and 35, right-hand vertical support plate 230 has pivotably fastened to right-hand face 231 thereof a first, lower right horizontal linkage bar 237. The latter has a parallel vertically disposed right (outer) and left (inner) faces 238, 239, respectively. As shown in FIGS. 11 and 14A, lower right linkage bar 237 is connected to right-hand vertical support plate 231 by a first, lower front right pivot joint 240 having a transversely disposed pivot axle 241 which enables the lower right linkage bar to pivot in a vertical plane relative to right vertical support plate 230.

As may be seen best by referring to FIGS. 14A, 15, 21, and 35, lower right-hand linkage bar 237 is pivotably coupled at a rear end thereof by a lower left rear pivot joint 237A having a transversely disposed pivot axis 237B to a transducer support block 242. The latter has a substantially great lateral thickness, and an L-shaped uniform cross section including a forwardly disposed lower horizontal leg section 243, and an upstanding rear vertical leg section 244. As may be seen best by referring to FIGS. 12, 14A and 15, transducer support block 242 has formed in front horizontally disposed leg section 243 thereof a transversely centrally located, generally rectangularly-shaped front slot 245 which extends rearwardly of front face 246 of the leg section, the slot penetrating lower face 247 of the transducer support block. Also, transducer support block 242 has formed therein a transversely centrally located, generally rectangularly-shaped rear slot 248 of greater width than front slot 245, the rear slot extending forward from rear face 249 of the transducer support block, penetrating lower face 247 of the support block and communicating with front slot 245. Rear and front slots 248 and 245 provide clearance for a cylindrically-shaped rear stack 250 of piezoelectric disks comprising part of ultrasonic transducer 59, and for cylindrically-shaped intermediate longitudinal portion 61 of the transducer, respectively. Intermediate longitudinal portion 61 of transducer 59 is secured within a circular aperture 251 provided through a transversely disposed clamp plate 252. The latter is located at a vibration node of transducer 59, and is secured to front face 246 of transducer support block 242, by screws 243A for example. As shown in FIG. 15, transducer support block 242 has vertically disposed, parallel right and left faces 253, 254, respectively.

Referring now to FIGS. 11, 12, 15, and 37, it may be seen that linkage assembly 228 for suspending transducer mount assembly 60 from upper head support base member 194 includes a second, lower left horizontal linkage bar 255. The latter has longitudinally disposed parallel, vertical, left (outer) and right (inner) faces 256, 257, respectively. As shown in FIGS. 12 and 15, lower left linkage bar 255 is secured irrotationally to transducer support block 242 by a pair of longitudinally spaced apart and aligned Allen screws 258, in parallel alignment with lower face 247 of the transducer support block.

Referring now to FIGS. 35–38 in addition to FIGS. 12 and 15, it may be seen that lower left linkage bar 255 is longer than lower right linkage bar 237. Thus, as shown in FIG. 15, lower right-hand linkage bar 237 has a convex arcuately curved front face 258 which is located just slightly forward of bonding tool tip 67, while lower left linkage bar 255 has a similarly shaped front face 259 which is located substantially forward of the bonding tool tip.

As shown in FIGS. 11, 12, 15, and 24, 25, an L-shaped left front bell crank 260 is pivotably coupled to a front end portion 261 of lower left horizontal linkage bar 255, in a manner which will now be described. Bell crank 260 serves to couple eccentric motion of cam wheel 210 to clamp jaws 207, as will be described below.

Figures 24, 25:
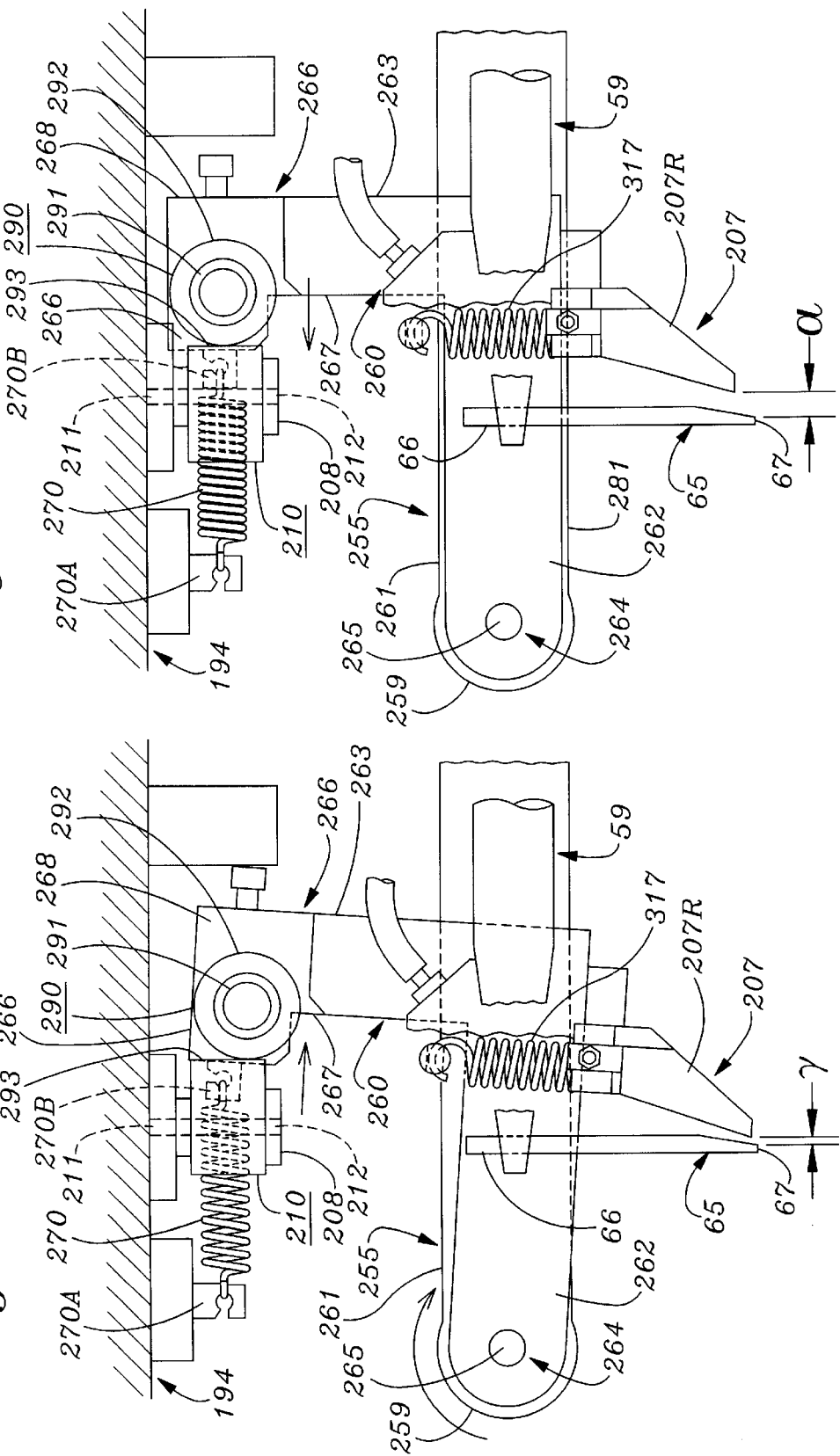
FIG. 24 is a fragmentary longitudinal sectional view of the head configured as shown in FIG. 22, taken along line 24—24.
FIG. 25 is a fragmentary longitudinal sectional view similar to that of FIG. 24, but showing the wire feed clamp disposed as shown in FIG. 23, and taken along line 25—25 of FIG. 23.

Referring to FIGS. 12, 15, and 24, it may be seen that L-shaped front left bell crank 260 has a generally longitudinally disposed, forwardly protruding lower front portion 262, and a rear upstanding portion 263 which depends perpendicularly upwards from the rear end of the front portion. Lower left linkage bar 255 is pivotably connected near front end 259 thereof to longitudinally disposed portion 262 of L-shaped bell crank 260, near their respective front ends, by a lower left front pivot joint 264 having a transversely disposed pivot axle 265 which enables relative pivotable motion in a vertical plane between the lower left linkage bar and the L-shaped bell crank.

As shown in FIGS. 11 and 24 rears upwardly disposed portion 263 of L-shaped bell crank 260 has an upper rear transversely disposed generally rectangular bar-shaped arm 266 which protrudes perpendicularly inwardly from vertical portion 262, i.e., to the right in FIG. 11. Arm 266 has protruding longitudinally forward of the front, transversely disposed vertical, surface 267 thereof, near inner longitudinally disposed vertical end face 288 thereof, a boss 269 having disposed laterally therethrough a transversely disposed cam follower axe bore 291. The latter protrudes perpendicularly rightward from boss 269 rearwards of cm wheel 210. A cam follower comprising a roller bearing 290 is rotatably mounted on axle 291, and has a front vertical tangent surface which is urged against rear peripheral surface 293 of cam wheel 210 by a tension spring 270. Thus, as shown in FIGS. 24 and 25, tension spring 270 is disposed longitudinally between a front hook 270A which protrudes downwards from base 194 of bonding tool head 271 and a rear hook 270A which protrudes forward from upper bell crank arm 266, thus urging the upper bell crank arm and cam follower 290 forward. This arrangement enables upstanding vertical upper portion 263 of L-shaped left front bell crank 260 to pivot in a vertical plane relative to upper boss portion 194 of head 171, in response to eccentric rotation of cam wheel 210.

Figure 37:
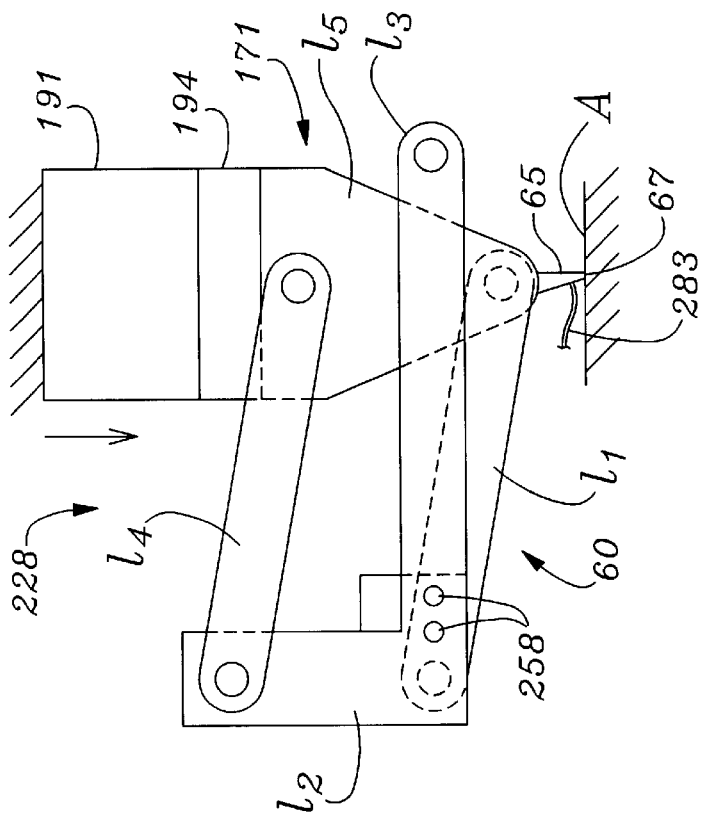
FIG. 37 is a left-hand view showing the structure of FIG. 35.

Referring now to FIGS. 11, 12 and 37, it may be seen that linkage assembly 228 includes a fourth, upper ft longitudinal linkage bar 273. Upper left linkage bar 273 has generally parallel, longitudinally disposed vertical left (outer) and right (inner) fares 274, 275, respectively. Upper left linkage bar 273 is pivotably connected near a front end thereof to short left-hand support plate 234, which depends downwardly from the left side of upper bonding tool head support bar 194, by a front upper left pivot joint 276, which has a transversely disposed pivot axle 277. Also, upper let linkage bar 273 is pivotably connected near a rear end thereof to rear upstanding portion 244 of L-shaped transducer support block 242, near an upper end of 244, by a rear upper left pivot joint, the latter having a transversely disposed pivot axle 279. Front and rear pivot joints 276, 278 enable front and rear ends of upper left horizontal linkage bar 273 to pivot in a vertical plane relative to upper bonding tool head support base 194 and transducer support block 242, respectively.

Figure 18:
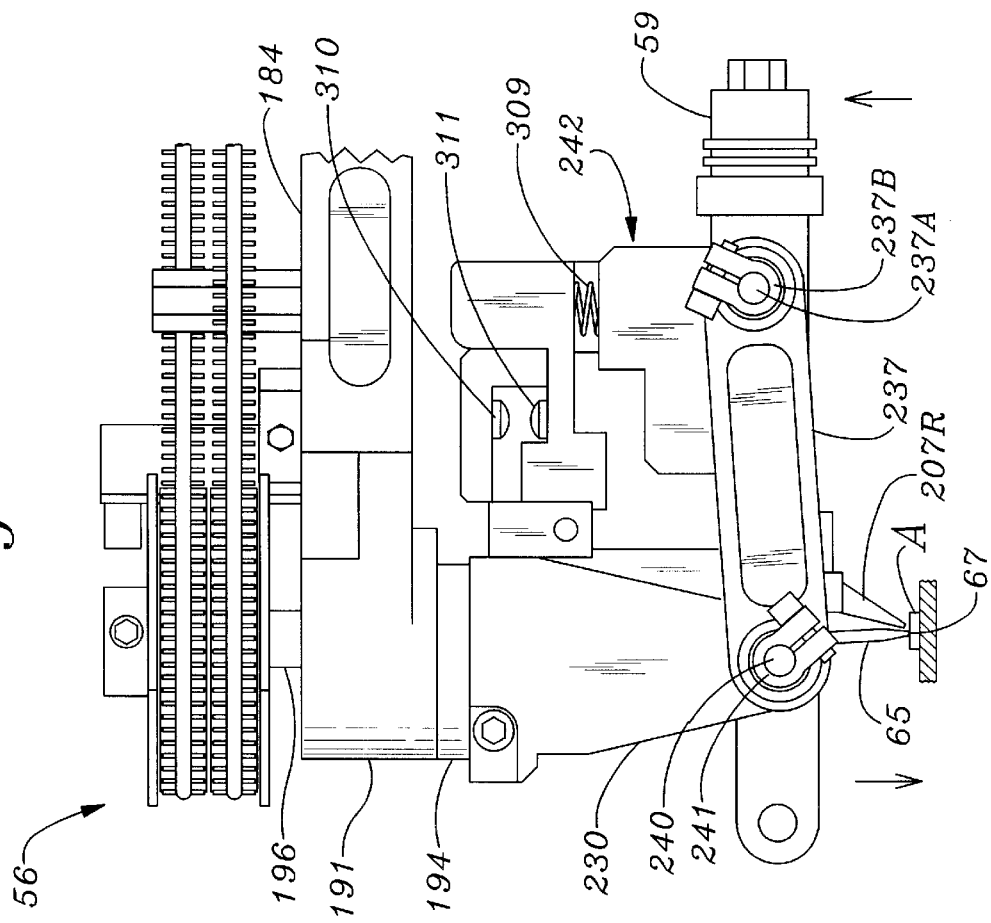
FIG. 18 is a fragmentary right side elevation view similar to that of FIG. 14A, but showing the head moved downwardly to cause the bonding tool tip to contact a work surface.
Figure 19:
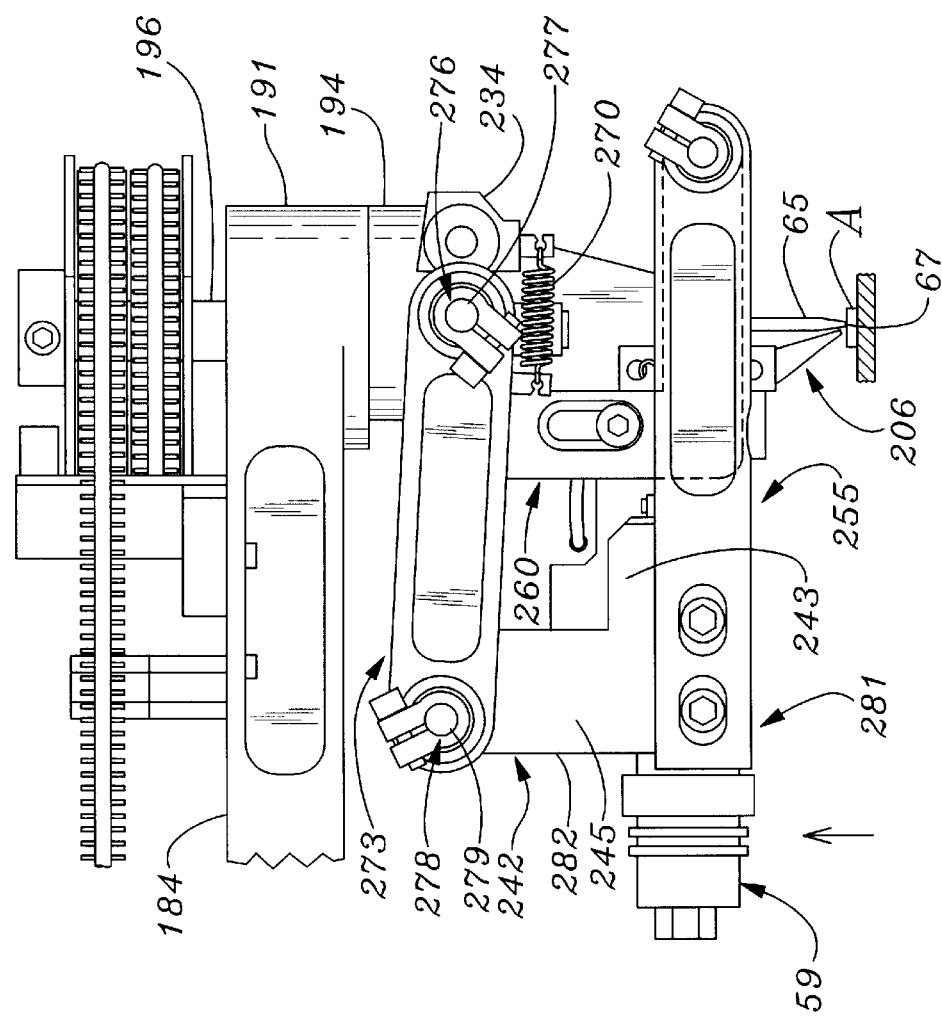
FIG. 19 is a left side elevation view of the orbital head assembly positioned as shown in FIG. 18.
Figure 20:
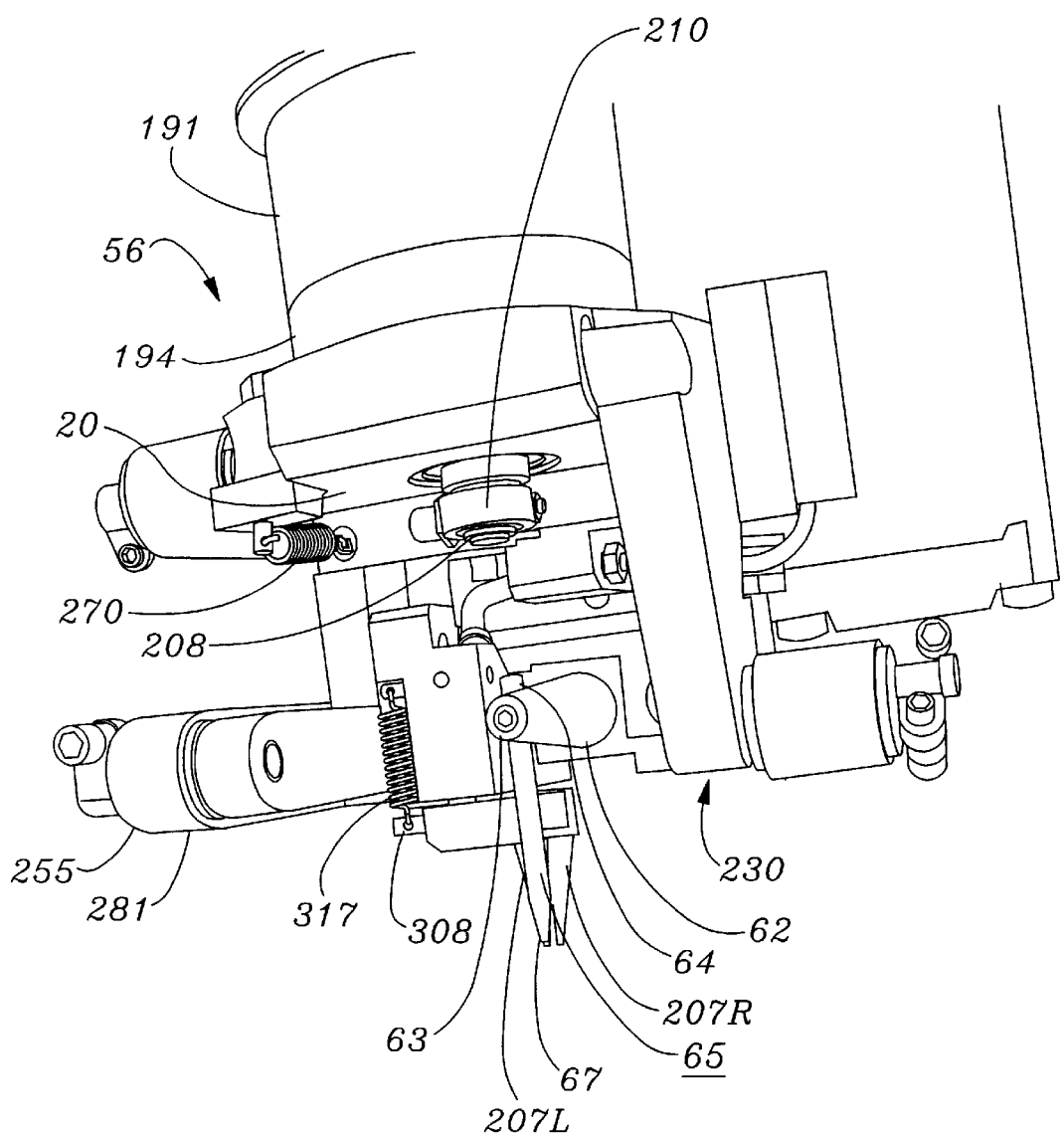
FIG. 20 is a fragmentary lower right-hand perspective view of the bonding tool head assembly of FIG. 11.
Figure 21:
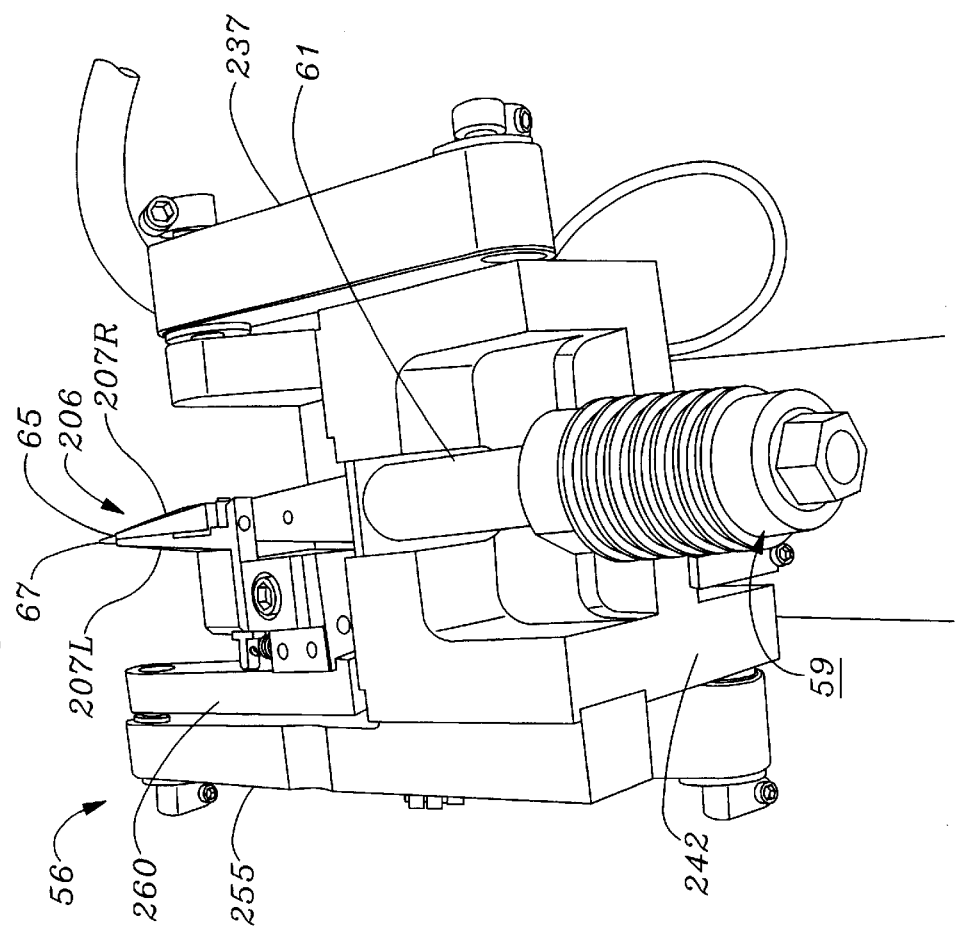
FIG. 21 is a fragmentary lower rear perspective view of the bonding tool head assembly of FIG. 11.
Figure 22:
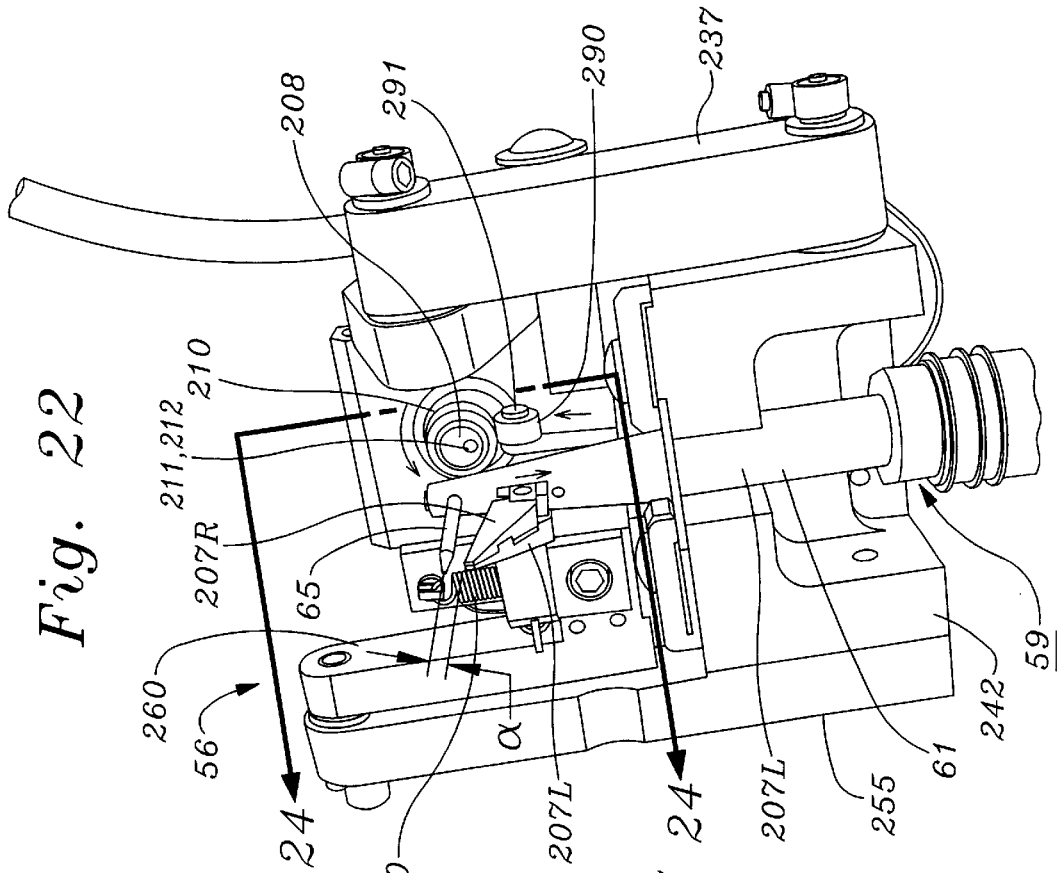
FIG. 22 is a fragmentary lower perspective view of the bonding tool head of FIG. 11, showing the eccentric surface of a wire feed clamp cam wheel at a minimum radius spacing relative to a rear laterally disposed cam follower.
Figure 23:
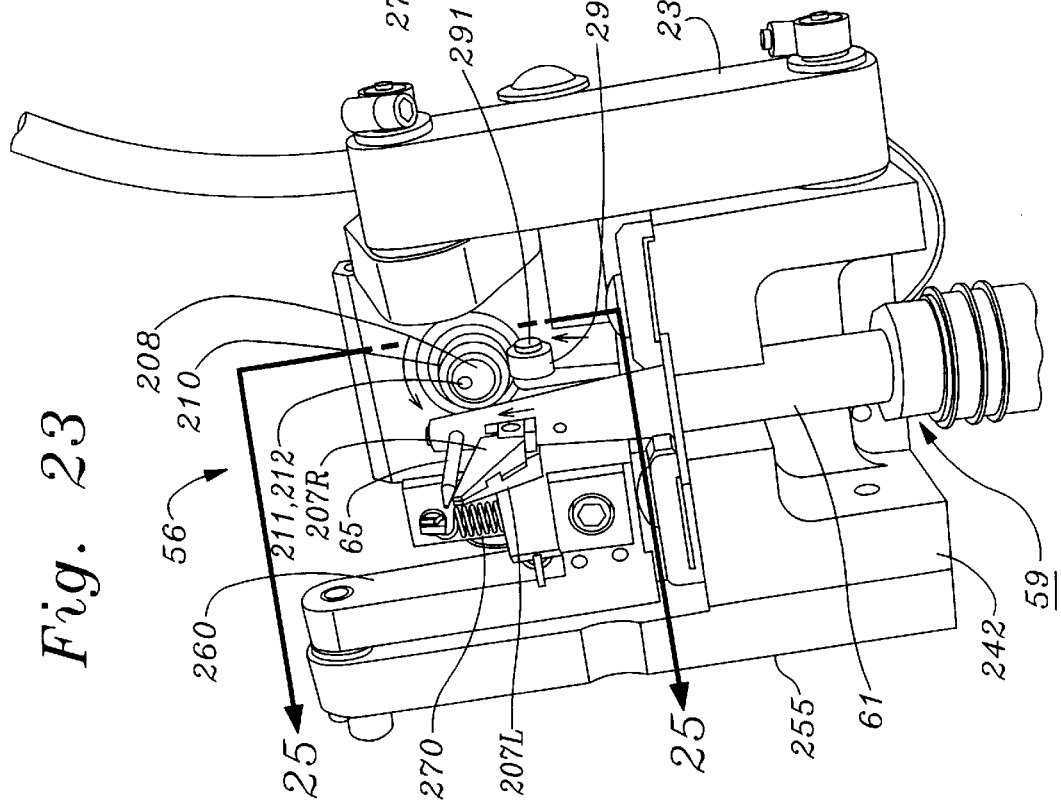
FIG. 23 is a fragmentary lower perspective view similar to that of FIG. 22, but showing the maximum radius of the cam wheel directed rearward, thus causing an upper laterally disposed bell crank arm to be displaced to a maximum rearward position, and a rear upwardly disposed vertical arm of the bell crank and attached rear portion of forward protruding clamp support bar to pivot downwardly relative to a lower, largest left-hand bar of a four-bar linkage.
Figure 36:
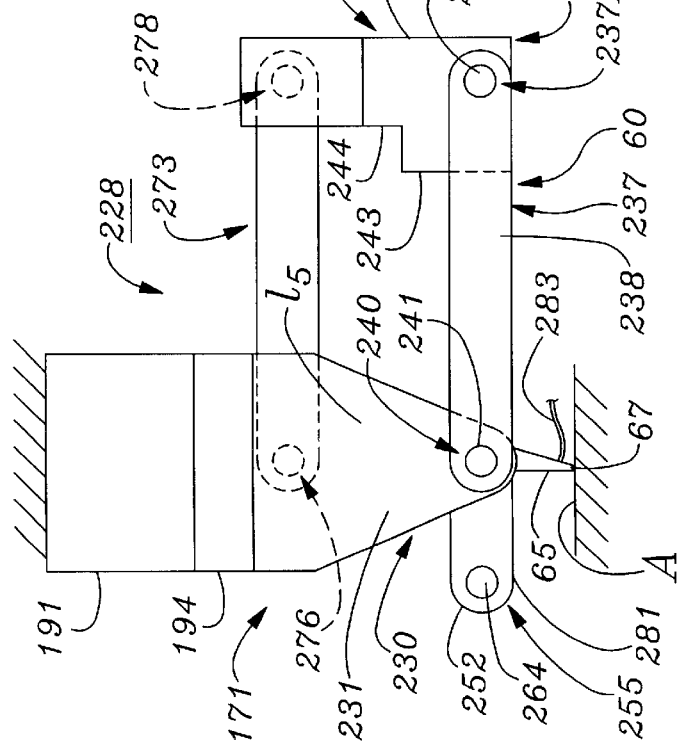
FIG. 36 is a view similar to that of FIG. 35, but showing elements of the linkage mechanism and a bonding tool attached thereto translated upwardly an exaggerated distance in response to downward motion of the head causing contact of the bonding tool tip with a workpiece.
Figure 38:
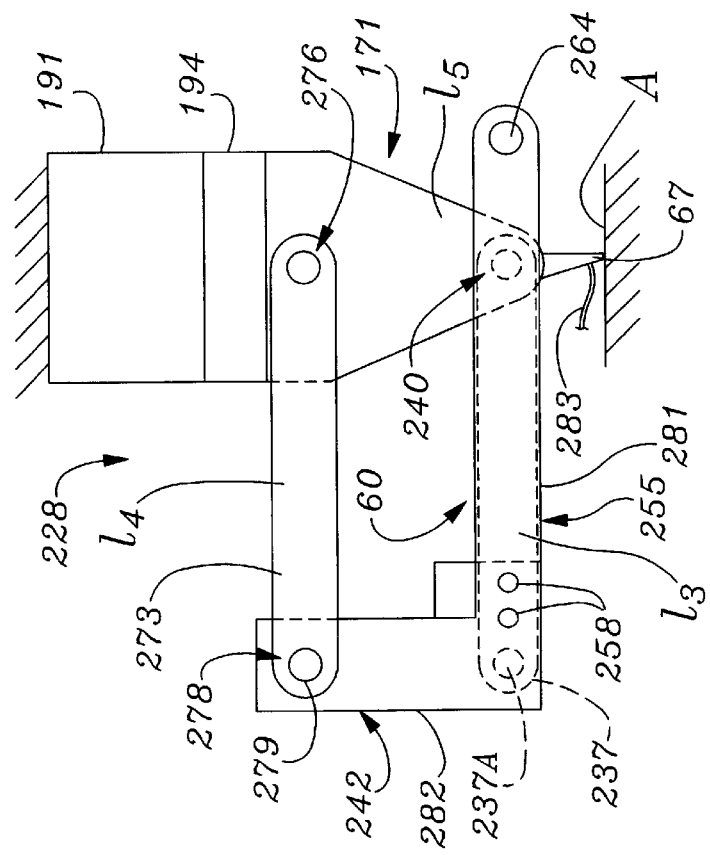
FIG. 38 is a left-hand view showing the structure of FIG. 36.

Linkage assembly 228 enables tip 67 of bonding tool 65, which is located below and axially aligned with the rotation axis of head support spindle 196, to translate resiliently upwardly along that axis, with no radial motion component which might cause the tool tip to scuff a bonding site. Thus, as shown in FIGS. 18–20 and particularly FIGS. 36 and 38, when orbital bonding head assembly 56 is translated downwardly to press tool tip 67 against a workpiece A with a predetermined force to effect a bond, the tool tip, ultrasonic transducer 59, and ultrasonic transducer support block 242 all translate vertically upwards with respect to upper support base 194 for bonding tool head assembly 171. As shown in FIGS. 20, 36 and 38, this resilient response motion occurs with lower surface 281 of lower left horizontal linkage bar 255 positioned parallel to the surface of workpiece A. Therefore, since rear surface 282 of ultrasonic transducer support block 242 is perpendicular to lower linkage bar surface 281, that surface translates in a vertical plane, while L-shaped linkage bar 260 and upper left linkage bar 273 pivot about their respective pairs of end joints, as shown in FIGS. 20, 36 and 38. Also, during this motion, as shown in FIGS. 18, 24, 25 and 36, lower right longitudinal linkage bar 237 pivots in a vertical plane about front pivot joint 241 relative to right-hand support plate 230, while the rear end of the lower right longitudinal linkage bar pivot in a vertical plane with respect to transducer support block 242.

FIGS. 11, 12, 21, and 23–29 show details of the structure and function of wire feed clamp assembly 206.

Referring first to FIG. 12, wire 283 from a wire supply spool 71 is fed through the upper entrance opening 285 of wire guide bore 211 which extends axially through the entire length of spindle 196 and cam wheel drive shaft 208. As shown in FIG. 14B, automatic wire bonding machine 50 includes a drag tube 300 for frictionally resisting motion of wire supplied from wire supply spool 71 and fed through wire guide bore 68 of ultrasonic bonding tool 65. This frictional resistance, or drag, is created by friction between the wire and the inner wall surface of a capillary bore through the drag tube. As shown in FIG. 14B, drag tube 300 consists essentially of an elongated tube of uniform cross section having a straight lower portion 301 which is secured in a bore 287 disposed vertically through ultrasonic transducer 59. Drag tube 300 also has an arcuately curved intermediate portion 302 which connects at its lower end to straight lower portion 301, and at its upper end to a relatively straight front end portion 303 which angles upwardly and forwardly from the intermediate portion.

Drag tube 300 has disposed through its length a small diameter, i.e., capillary, bore 304. In an example embodiment, drag tube 300 has an outer diameter of 0.028 inch, and bore 304 has a diameter of about 0.016 inch, i.e., about 0.0144 inch larger than the 0.00125 inch diameter of gold bonding wire machine 50 is intended to be used with.

As shown in FIGS. 12 and 14B, front portion 303 of drag tube 300 is angled at about 60 degrees upwardly and forwardly from lower vertical portion 301 of the drag tube, and has an upper entrance opening 305 located below and rearward of the lower exit opening 306 of wire guide bore 211 through wire feed clamp drive shaft 208. With this arrangement, wire 283 exiting from lower exit opening 306 of wire guide bore 211 angles rearward and enters opening 305 of bore 304 through drag tuber 300, and is bent sufficiently in transition section 302 of the drag tube located between upper front angled portion 303 and lower vertical portion 301 for a frictional retarding force to be exerted on the wire by the capillary bore walls, the force being smaller than required to bend the wire beyond its elastic limit. Wire exiting vertically from bottom exit opening 307 of capillary bore 304 through drag tube 300 angles downwardly and forwardly between left and right wire clamp blades 207L, 207R. A front end portion of wire 283 protruding forward from clamp blades 207L, 207R enters a rear entrance opening 70 of wire feed guide bore 68 disposed diagonally through ultrasonic bonding tool 65, exits that bore through front exit opening 69 of the bore, and underlies front lower working face or toe 67 of the bonding tool.

As described above and shown in FIGS. 11, 24, and 25, wire feed mechanism 206 includes a cam follower comprising a circular roller bearing 290 having a transversely disposed bearing axle 291, the roller bearing having an outer circumferential surface 292 which resiliently contacts an outer circumferential surface 293 of eccentrically mounted, circular cam wheel 210. Since the axis of rotation of cam wheel 210 is vertically disposed, a tangent plane defining the contact area of cam follower surface 292 with cam wheel surface 293 lies in a vertical plane. As shown in FIGS. 24 and 25, this arrangement enables cam follower bearing 290 to precisely track eccentric rotation of cam wheel 210, for various relative vertical displacements between the cam follower and cam wheel, as long as the cam follower longitudinally contacts some portion of the surface of circumferential cam wheel 210.

FIGS. 35–38 illustrate the novel construction and function of linkage mechanism 228, which enables bonding tool 65 to be located colinearly below the rotation axis of orbital bonding tool head 171 and axially aligned with the vertical translation axis of the head, yet constrains tip 67 of the bonding tool to move resiliently upward solely along the common axis of vertical translation and rotation, when the head is translated downwardly to contact a workpiece with the tip of the bonding tool.

As shown in FIGS. 35–38, novel linkage mechanism 228 includes a first, lower right longitudinally disposed linkage bar 237 (l1) pivotably coupled at a front end thereof by a first, lower right pivot joint 240 to vertically disposed plate member 231. First linkage bar 237 is pivotably coupled at a rear end thereof to the right-hand face of a second, laterally disposed rear bar member 242 (I2) having a relatively thick, L-shaped cross section, by a second, lower right rear pivot joint 237A.

As shown in FIGS. 37 and 38, linkage mechanism 228 includes a third, lower left longitudinally disposed linkage bar 255 (I3) which is rigidly coupled at right angles to the left side of laterally disposed rear bar member 242. The front end of lower left longitudinally disposed linkage bar 255 is not required to be connected to any other element of linkage mechanism 228. Accordingly, linkage bar 255 can be of any length, and, as shown in FIGS. 37 and 38, may extend substantially forward of other elements of the linkage mechanism and provide a pivot attachment point 264 for L-shaped bell crank 260 of wire clamp assembly 206.

As shown in FIGS. 37 and 38, linkage mechanism 228 according to the present invention includes a fourth, upper left, longitudinally disposed linkage bar 273 (I4). Linkage bar 273 is pivotably coupled at a rear end thereof to the left side of rear transverse linkage bar 242, near the upper end thereof, by a pivot joint 278. Also, linkage bar 273 is coupled near a front end thereof by a pivot joint 276 to the left side of upper base portion 194 of bonding tool head 171. Vertically disposed plate member 231, which depends downwardly from the right side of upper base portion 194, consitutes a fifth bar member (I5) of linkage mechanism 228. With this novel construction of linkage mechanism 228, as shown in FIGS. 34–37, the lower surface of rear transverse linkage bar 242, which supports ultrasonic transducer 59, is constrained to remain horizontal as the rear linkage bar translates vertically with respect to upper base portion 194, thus ensuring that tip 87 of bonding tool 65 moves only in a vertical direction.

FIG. 20 shows a tension spring 317 which biases wire clamp jaws 207R, 207L to a closed, clamping position.

FIG. 18 illustrates resilient upward motion of bonding tool tip 67 in response to a downwardly directed bonding force exerted by the bonding toot tip on a workpiece, in which a compression spring 309 is compressed. FIG. 14A shows spring 309 in an uncompressed state. FIGS. 14A and 18 also illustrate the separation of upper and lower electrical contact buttons 310 and 311 in response to contact of tool tip 67 with a workpiece, to thereby initiate application of a pulse of electrical energy of predetermined magnitude to ultrasonic transducer 54.

Figure 9:
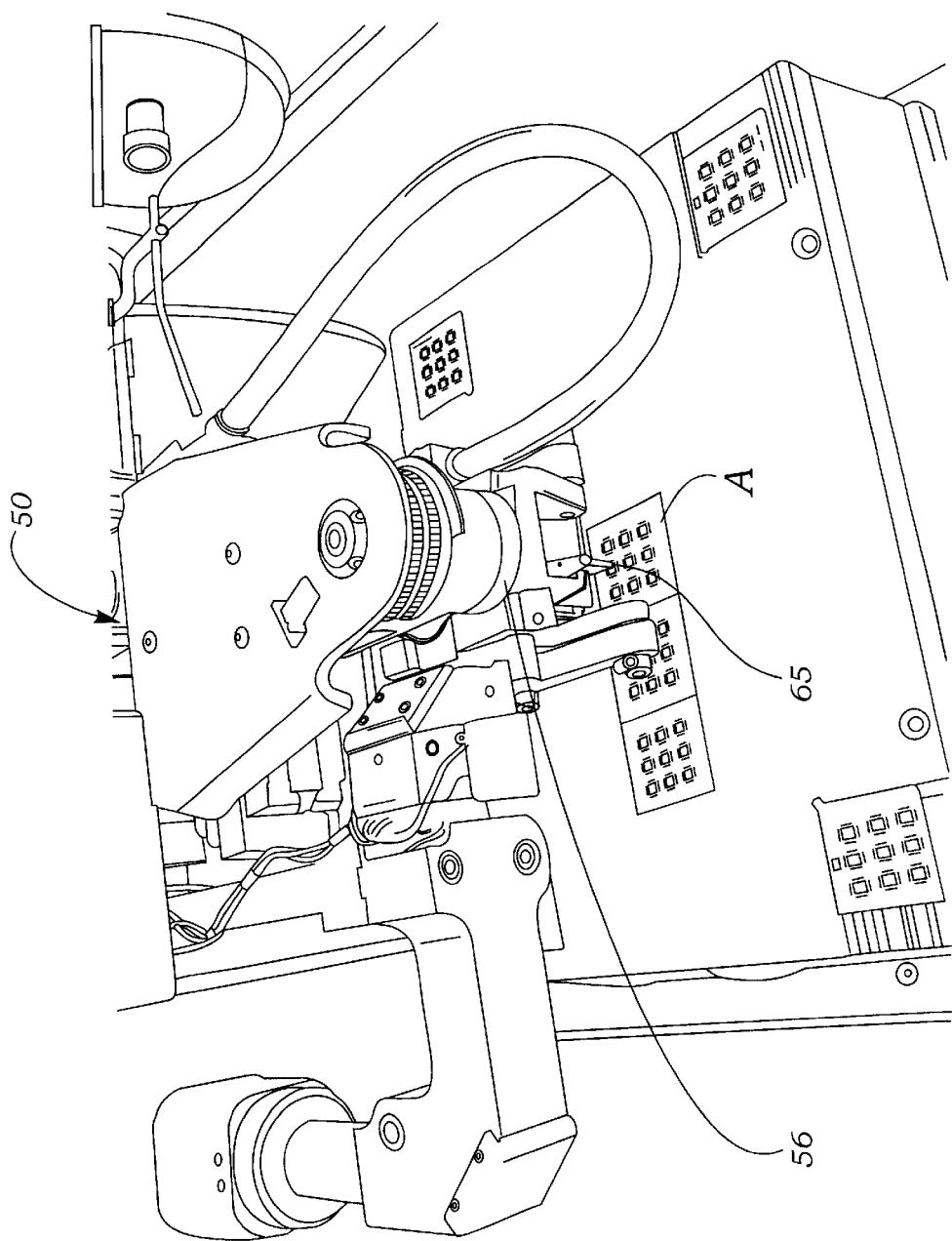
FIG. 9 is a fragmentary upper left front perspective view of the machine of FIG. 1, showing an orbital bonding head thereof in a zero-degree orientation, with a wedge bonding tool protruding forward to contact a first bond site on a workpiece.

FIG. 9 is a perspective view of bonding machine 50, showing rotatable bonding tool head 56 thereof in a "zero-degree" orientation, with wedge bonding tool 65 protruding forward to contact a first bond side on a workpiece A for making a first bond.

Figure 10:
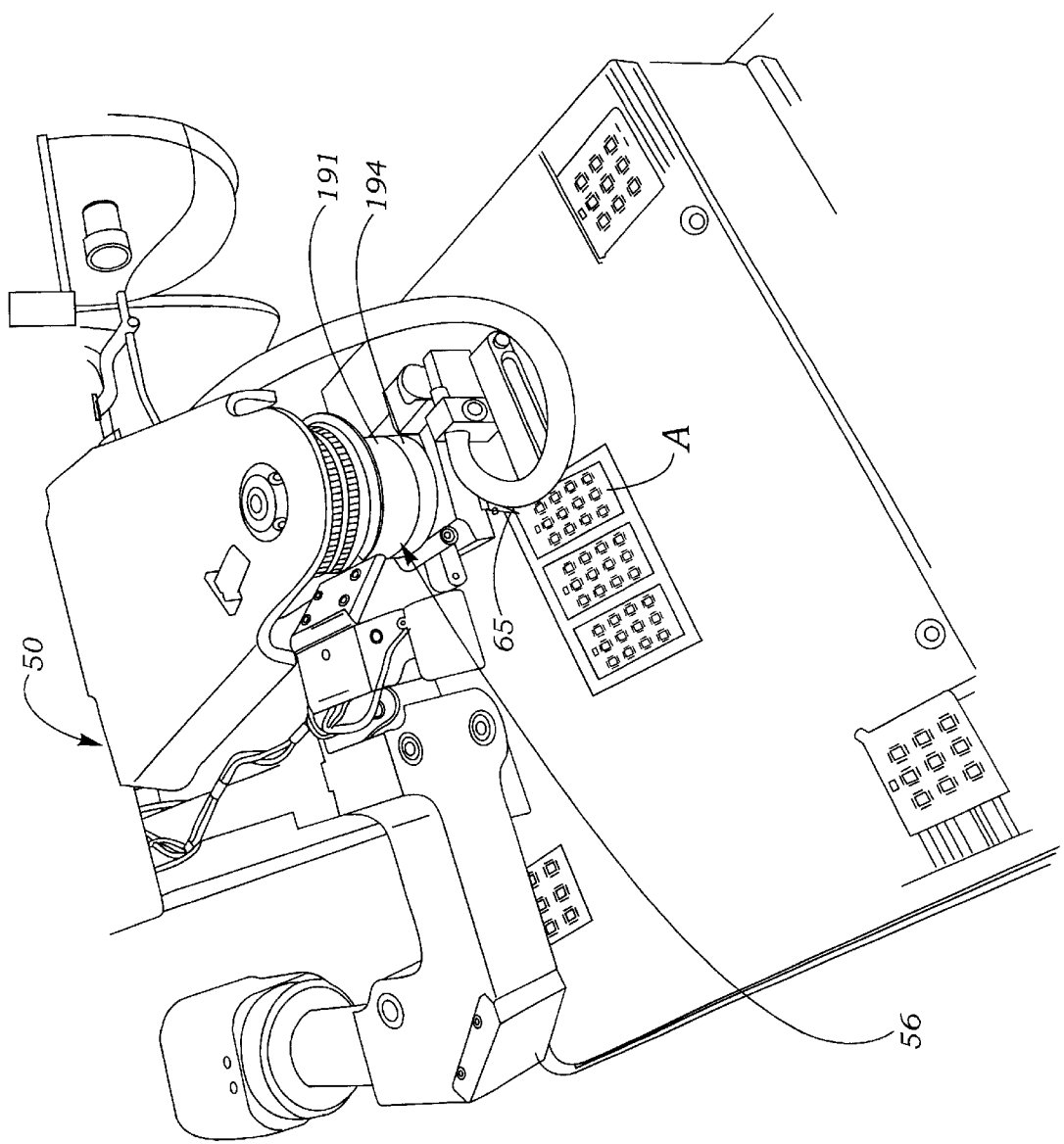
FIG. 10 is a view similar to that of FIG. 9, but showing the orbital bonding head rotated ninety degrees clockwise, and translated to the right, and the bonding tool protruding leftwardly.

FIG. 10 is a view similar to that of FIG. 9, but showing bonding tool head base 194 rotated ninety degrees clockwise with respect to head support boss 191, thus positioning bonding tool 65 to a leftwardly protruding orientation, for making a second bond.

What is claimed is:

1. A machine for making ultrasonic wire bonds comprising;
   a. an orbital bonding tool head rotatable about a longitudinal head rotation axis therethrough and having disposed longitudinally therethrough a wire transit bore coaxial with said head rotation axis for longitudinally translatably receiving a length of bonding wire,
   b. translational positioning means for translatably positioning said orbital bonding tool head responsive to first, translational drive signals to precisely pre-determinable positions in a three-dimensional coordinate space relative to a workpiece,
   c. rotational positioning means for rotating said orbital bonding tool head about said longitudinal head rotation axis thereof in response to second, rotational drive signals to precisely pre-determ inable rotational orientations relative to a workpiece,
   d. an ultrasonic transducer,
   e. transducer support means attached to said orbital bonding tool head for supporting said ultrasonic transducer,
   f. an ultrasonic bonding tool mechanically coupled to said ultrasonic transducer, said bonding tool having a tip coaxially aligned with said longitudinal head rotation axis of said orbital bonding tool head and a wire feed bore therethrough for receiving wire from said wire transit bore through said bonding tool head, and
   g. thus enabling said tip of said bonding tool to be positioned at a first bond site location on a workpiece, an ultrasonic wire bond formed thereat, said bonding tool head rotated by said rotational positioning means to align said wire feed bore of said bonding tool relative to a second bond site, and said tip of said bonding tool translated by motion of said translational positioning means to said second bond site, said bonding wire paying out through said wire supply bore and said wire feed bore without twisting.

2. The machine of claim 1 wherein said translational positioning means is further defined as including a support structure, a first tool support platform, means for translatably supporting said first tool support platform by said support structure, and first drive motor means for translating said first platform along a first coordinate direction relative to said support structure.

3. The machine of claim 2 wherein said translational positioning means is further defined as including a second tool support platform, means for translatably supporting said second tool support platform by said first toot support platform, and second drive motor means for translating said second platform along a second coordinate direction relative to said first platform.

4. The machine of claim 3 wherein said translational positioning means is further defined as including a third tool support platform, means for translatably supporting said third tool support platform by said second tool support platform, and third drive motor means for translating said third platform along a third coordinate direction relative to said second platform.

5. The machine of claim 4 wherein said rotational positioning means is further defined as including head support means attached to said third tool support platform, means for rotatably supporting said bonding tool head by said head support means, and first rotational drive motor means for rotating said head about a head rotation axis.

6. The machine of claim 1 wherein said rotational positioning means is further defined as including head support means attached to said translational positioning means, means for rotatably supporting said bonding tool head by said head support means, and first rotational drive motor means for rotating said head about a head rotation axis.

7. The machine of claim 6 wherein said head support means has disposed longitudinally therethrough a wire supply bore coaxially aligned with said wire transit bore of said orbital bonding tool head.

8. The machine of claim 7 wherein said bonding tool head is further defined as including an upper support base portion and a parallelogram linkage frame coupling said upper support base portion to said transducer, said parallelogram linkage frame enabling a tip of said bonding tool to be displaced only vertically in response to a reaction force exerted thereon by translating said head to thereby press said tool tip into contact with a workpiece.

9. The machine of claim 8 wherein said parallelogram linkage frame is further defined as including;
   a. a first, lower right-hand longitudinally disposed linkage bar pivotably coupled near a front end thereof by a first, front lower right pivot joint to a lower right side of said head,
   b. a second, laterally disposed, vertically elongated rear bar member comprising a transducer support block pivotably coupled at a lower right side thereof to a rear end of said first linkage bar by a second, rear lower right pivot joint,
   c. a third, lower left, longitudinally disposed linkage bar rigidly coupled to a lower left side of said second, laterally disposed rear bar member, and
   d. a fourth, upper left longitudinally disposed linkage bar pivotably coupled near a front end thereof by a third, front upper left pivot joint to an upper left side of said head, and near a rear end thereof by a fourth, rear upper left pivot joint to an upper left side of said second, laterally disposed rear bar member.

10. The machine of claim 9 further including wire feed means attached to said head for feeding bonding wire to said bonding tool.

11. The machine of claim 10 wherein said wire feed means is further defined as including a wire clamp having a pair of laterally opposed blades adapted to receive therebetween wire from a supply reel, blade actuator means for reciprocally moving said blades together to clamp on a wire and apart to enable free passage of said wire between said blades, and clamp actuator means for reciprocally moving said clamp towards and away from said bonding tool.

12. The machine of claim 11 wherein said clamp actuator means is further defined as comprising in combination a clamp support, a clamp actuator motor located remotely from said head, and clamp actuator coupling means for coupling force produced by said clamp actuator motor to said clamp support.

13. The machine of claim 12 wherein said clamp actuator coupling means is further defined as comprising a clamp actuator drive shaft having a rotation axis coaxially aligned with said head rotation axis, input clamp actuator drive coupling means for coupling force produced by said clamp actuator motor to said clamp actuator drive shaft, and output clamp actuator drive coupling means for coupling motion of said drive shaft to said clamp support independently of rotation angle of said head relative to said head support means.

14. The machine of claim 13 wherein said output clamp actuator drive means is further defined as including a bell crank pivotally mounted to said third, lower left longitudinally disposed linkage bar.

15. A machine for making ultrasonic wire bonds comprising;
   a. a gantry,
   b. at least a first, X-axis tool support platform translatably supported from said gantry, and comprising a first one of a cascaded series of mutually translatable members,
   c. an orbital bonding tool head depending downwardly from said first tool support platform, said head being rotatable about a head rotation axis perpendicular to said first tool support platform and having disposed therethrough a wire transit bore coaxial with said head rotation axis for translatably receiving a length of bonding wire,
   d. transducer support means attached to said orbital bonding tool head for supporting an ultrasonic transducer,
   e. an ultrasonic transducer,
   f. an ultrasonic bonding tool depending downwardly from said ultrasonic transducer, said bonding tool having a tip coaxially aligned with said head rotation axis of said orbital bonding tool head and a wire feed bore therethrough for receiving wire from said wire transit bore through said bonding tool head,
   g. first translational positioning means for translating said first tool support platform responsive to first translational drive signals relative to said gantry, to thereby precisely position said tip of said bonding tool in a first direction relative to a workpiece, and
   h. first rotational positioning means for rotating said bonding tool head responsive to first rotational drive signals to a precisely pre-determinable angular orientation relative to said workpiece.

16. The machine of claim 15 further including a second, Y-axis tool support platform located between said first, X-axis tool support platform and said orbital bonding tool head, said second platform being translatably supported by said first platform.

17. The machine of claim 16 further including second translational positioning means for translating said second tool support platform responsive to second translational drive signals, relative to said first platform.

18. The machine of claim 17 further including a third, Z-axis tool support platform located between said second, Y-axis tool support platform and said orbital bonding tool head, said third platform being translatably supported by said second platform.

19. The machine of claim 18 further including third translational positioning means for translating said third tool support platform responsive to third translational drive signals, relative to said second platform.

20. The machine of claim 15 further including a head support assembly mounted to a last one of said cascaded series of translatable members, said head support assembly rotatably supporting said orbital bonding tool head.

21. The machine of claim 20 wherein said first rotational positioning means is further defined as comprising in combination a spindle supporting said orbital bonding tool head and rotatably mounted to said head support assembly, a rotary motor, and means for coupling rotary motion of said rotary motor to said spindle.

22. The machine of claim 21 wherein sad rotary motor is further defined as being attached to said head support assembly.

23. The machine of claim 22 wherein said orbital bonding tool head is further defined as including an upper support base portion which depends downwardly from said spindle, and a parallelogram linkage frame which depends downwardly from said upper support base portion, said parallelogram linkage frame coupling said upper support base portion to said transducer.

24. The machine of claim 23 wherein said parallelogram linkage frame is further defined as including;
   a. a first, lower right-hand longitudinally disposed linkage bar pivotably coupled near a front end thereof by a first, front lower right pivot joint to a lower right side of said head,
   b. a second, laterally disposed, vertically elongated rear bar member comprising a transducer support block pivotably coupled at a lower right side thereof to a rear end of said first linkage bar by a second, rear lower right pivot joint, c. a third, lower left, longitudinally disposed linkage bar rigidly coupled to a lower left side of said second, laterally disposed rear bar member, and d. a fourth, upper left longitudinally disposed linkage bar pivotably coupled near a front end thereof by a third, front upper left pivot joint to an upper left side of said head, and near a rear end thereof by a fourth, rear upper left pivot joint to an upper left side of said second, laterally disposed rear bar member.

25. The machine of claim 24 further including wire feed means attached to said head for feeding bonding wire to said bonding tool.

26. The machine of claim 25 wherein said wire feed means is further defined as including a wire clamp having a pair of laterally opposed blades adapted to receive therebetween wire from a supply reel, blade actuator means for reciprocally moving said blades together to clamp on a wire and apart to enable free passage of said wire between said blades, and clamp actuator means for reciprocally moving said clamp towards and away from said bonding tool.

27. The machine of claim 26 wherein said clamp actuator means is further defined as comprising in combination a clamp support, a clamp actuator motor located remotely from said head, and clamp actuator coupling means for coupling force produced by said clamp actuator motor to said clamp support.

28. The machine of claim 27 wherein said clamp actuator coupling means is further defined as comprising a clamp actuator drive shaft having a rotation axis coaxially aligned with said head rotation axis, input clamp actuator drive coupling means for coupling force produced by said clamp actuator motor to said clamp actuator drive shaft, and output clamp actuator drive coupling means for coupling motion of said drive shaft to said clamp support independently of rotation angle of said head relative to said head support means.

29. The machine of claim 28 wherein at least one of said head support spindle and said clamp actuator drive shaft fits coaxially within the other.

30. The machine of claim 29 wherein said claim actuator motor is further defined as being mounted to said head support assembly.

31. The machine of claim 30 wherein said clamp actuator drive means is further defined as including a cam wheel eccentrically mounted to a lower end of said clamp actuator drive shaft, and a bell crank which supports said clamp and which is pivotably mounted to said third, lower left longitudinally disposed linkage bar, said bell crank having protruding from an upper end thereof a cam follower having a rolling surface biased into contact with a circumferential surface of said cam wheel.

32. The machine of claim 31 wherein an inner one of said head drive spindle and said clamp actuator drive shaft has therethrough an axially disposed wire adapted to receive through an upper entrance opening to said bore bonding wire from a supply reel, and to pay out through a lower exit opening therein wire to said clamp assembly.

33. The machine of claim 32 further including a drag tube for frictionally resisting motion of wire supplied from a wire supply reel to said bore through said spindle, said drag tube comprising a curved tube having a straight lower portion secured in a bore disposed vertically through said transducer rearward of said tool, and an arcuately forwardly and upwardly angled upper portion.

34. An automatic ultrasonic wire bonding machine comprising;

a. a gantry, b. a first tool support platform translatably supported from said gantry, c. a first motor drive means for translating said first tool support platform in a first coordinate direction relative to said gantry, in response to first translational drive signals, d. a second tool support platform translatably supported from said first tool support platform, e. a second motor drive means for translating said second tool support platform in a second coordinate direction relative to said first tool support platform, in response to second translational drive signals, f. a third tool support platform translatably supported from said second tool support platform, g. a third motor driver means for translating said third tool support platform in a third coordinate direction relative to said second tool support platform, in response to third translational drive signals, h. an orbital bonding tool head, said head being rotatable about a head rotation axis perpendicular to said first tool support platform and having disposed therethrough a wire transit bore coaxial with said head rotation axis for translatably receiving a length of bonding wire, i. an orbital bonding tool head support assembly protruding from said third tool support platform, for rotatably supporting said orbital bonding tool head, j. a first rotational motor drive means for rotating said bonding tool head relative to said bonding tool head support assembly, k. transducer support means attached to said orbital bonding tool head for supporting an ultrasonic transducer, l. an ultrasonic transducer, and m. an ultrasonic bonding tool depending downwardly from said ultrasonic transducer, said bonding tool having a tip coaxially aligned with said head rotation axis of said orbital bonding tool head and a wire feed bore therethrough for receiving wire from said wire transit bore through said bonding tool head.

35. The automatic ultrasonic wire bonding machine of claim 34 wherein said orbital bonding tool head is further defined as including an upper support base portion rotatably coupled to said orbital bonding tool head support assembly, a parallelogram linkage frame which depends downwardly from said upper support base portion, and an ultrasonic transducer coupled to a lower portion of said parallelogram linkage frame.

36. The automatic ultrasonic wire bonding machine of claim 35 wherein said bonding tool head is further defined as including a wire feed mechanism attached to a lower portion of said parallelogram linkage frame.

37. The automatic ultrasonic wire bonding machine of claim 36 wherein said bonding tool head is rotatably supported from said bonding tool head support assembly by means of a hollow head drive spindle which protrudes upwardly from said upper support base portion of said orbital bonding tool head and through a bearing journal fitted in said bonding tool head support assembly, an upwardly protruding end of said spindle being fitted with a first drive pulley.

38. The automatic ultrasonic wire bonding machine of claim 37 wherein said wire feed mechanism includes a clamp actuator drive shaft which is disposed coaxially upwards through said head drive spindle.

39. The automatic ultrasonic wire bonding machine of claim 38 wherein said clamp actuator drive shaft has attached coaxially thereto a second drive pulley located above said bearing journal through said orbital bonding tool head support assembly.

40. The automatic ultrasonic wire bonding machine of claim 39 wherein said first rotational drive means comprises in combination a first rotational drive motor and means for coupling rotary drive force produced thereby to said first drive pulley attached to said drive spindle.

41. The automatic ultrasonic wire bonding machine of claim 40 further including second rotational motor drive means coupled to said second, clamp actuator drive shaft pulley.

42. The automatic ultrasonic wire bonding machine of claim 41 wherein said clamp actuator drive shaft is further defined as having disposed axially through its length a bore enabling a wire supplied from a source above said head support assembly to transit through said orbital bonding tool head to said wire feed mechanism.

43. A machine for making ultrasonic wire bonds comprising;
   a. an orbital bonding tool head,
   b. translational positioning means for translatably positioning an orbital bonding tool head responsive to first, translational drive signals to precisely pre-determinable positions in a three-dimensional coordinate space relative to a workpiece,
   c. rotational positioning means for rotating said orbital bonding tool head about a head rotation axis by second, rotational drive signals to precisely pre-determinable rotational orientations relative to a workpiece, said rotational positioning means including head support means attached to said translational positioning means, means for rotatably supporting said bonding tool head by said head support means, and first rotational drive motor means for rotating said head about a head rotation axis
   d. an ultrasonic transducer,
   e. transducer support means attached to said bonding tool head for supporting said ultrasonic transducer,
   f. an ultrasonic bonding tool mechanically coupled to said ultrasonic transducer, a portion of said bonding tool being axially aligned with said head rotation axis, and
   g. an upper support base portion of said bonding tool head and a parallelogram linkage frame coupling said upper support base portion of said bonding tool head to said transducer, said parallelogram linkage frame enabling a tip of said bonding tool to be displaced only vertically in response to a reaction force exerted thereon by translating said head to thereby press said tool tip into contact with a workpiece, said parallelogram linkage frame including;
      i. a first, lower right-hand longitudinally disposed linkage bar pivotably coupled near a front end thereof by a first, front lower right pivot joint to a lower right side of said head,
      ii. a second, laterally disposed, vertically elongated rear bar member comprising a transducer support block pivotably coupled at a lower right side thereof to a rear end of said first linkage bar by a second, rear lower right pivot joint,
      iii. a third, lower left, longitudinally disposed linkage bar rigidly coupled to a lower left side of said second, laterally disposed rear bar member, and
      iv. a fourth, upper left longitudinally disposed linkage bar pivotably coupled near a front end thereof by a third, front upper left pivot joint to an upper left side of said head, and near a rear end thereof by a fourth, rear upper left pivot joint to an upper left side of said second, laterally disposed rear bar member.

44. The machine of claim 43 further including wire feed means attached to said head for feeding bonding wire to said bonding tool.

45. The machine of claim 44 wherein said wire feed means is further defined as including a wire clamp having a pair of laterally opposed blades adapted to receive therebetween wire from a supply reel, blade actuator means for reciprocally moving said blades together to clamp on a wire and apart to enable free passage of said wire between said blades, and clamp actuator means for reciprocally moving said clamp towards and away from said bonding tool.

46. The machine of claim 45 wherein said clamp actuator means is further defined as comprising in combination a clamp support, a clamp actuator motor located remotely from said head, and clamp actuator coupling means for coupling force produced by said clamp actuator motor to said clamp support.

47. The machine of claim 46 wherein said clamp actuator coupling means is further defined as comprising a clamp actuator drive shaft having a rotation axis coaxially aligned with said head rotation axis, input clamp actuator drive coupling means for coupling force produced by said clamp actuator motor to said clamp actuator drive shaft, and output clamp actuator drive coupling means for coupling motion of said drive shaft to said clamp support independently of rotation angle of said head relative to said head support means.

48. The machine of claim 47 wherein said output clamp actuator drive means is further defined as including a bell crank pivotally mounted to said third, lower left longitudinally disposed linkage bar.

49. A machine for making ultrasonic wire bonds comprising;
   a. a gantry,
   b. a first, X-axis tool support platform translatably supported from said gantry, and comprising one of a cascaded series of mutually translatable members,
   c. first translational positioning means for translating said first tool support platform responsive to first translational drive signals relative to said gantry,
   d. a second, Y-axis tool support platform translatably supported by said first, X-axis tool support platform,
   e. a second translational positioning means for translating said second tool support platform responsive to second translational drive signals, relative to said first platform,
   f. a third, Z-axis tool support platform translatably supported by said second, Y-axis platform,
   g. a third translational positioning means for translating said third tool support platform responsive to third translational drive signals, relative to said second platform,
   h. a head support assembly mounted to said Z-axis tool support platform, for rotatably supporting and orbital bonding tool head,
   i. an orbital bonding tool head depending downwardly from said head support assembly, said head being rotatable about an axis perpendicular to said first tool support platform,
   j. transducer support means attached to said bonding tool head for supporting an ultrasonic transducer, k. an ultrasonic transducer,
l. an ultrasonic bonding tool depending downwardly from said ultrasonic transducer,
m. first rotational positioning means for rotating said bonding tool head responsive to first rotational drive signals to a precisely pre-determinable angular orientation relative to a workpiece, said first rotational positioning means comprising in combination a spindle supporting said orbital bonding tool head and rotatably mounted to said head support assembly, a rotary motor attached to said head support assembly, and means for coupling rotary motion of said rotary motor to said spindle, an upper support base portion for said orbital bonding tool head which depends downwardly from said spindle, and a parallelogram linkage frame which depends downwardly from said upper support base portion, said parallelogram linkage frame coupling said upper support base portion to said transducer, said parallelogram linkage frame including;
 i. a first, lower right-hand longitudinally disposed linkage bar pivotably coupled near a front end thereof by a first, front lower right pivot joint to a lower right side of said head,
 ii. a second, laterally disposed, vertically elongated rear bar member comprising a transducer support block pivotably coupled at a lower right side thereof to a rear end of said first linkage bar by a second, rear lower right pivot joint,
 iii. a third, lower left, longitudinally disposed linkage bar rigidly coupled to a lower left side of said second, laterally disposed rear bar member, and
 iv. a fourth, upper left longitudinally disposed linkage bar pivotably coupled near a front end thereof by a third, front upper left pivot joint to an upper left side of said head, and near a rear end thereof by a fourth, rear upper left pivot joint to an upper left side of said second, laterally disposed rear bar member.

50. The machine of claim 49 further including wire feed means attached to said head for feeding bonding wire to said bonding tool.

51. The machine of claim 49 wherein said wire feed means is further defined as including a wire clamp having a pair of laterally opposed blades adapted to receive therebetween wire from a supply reel, blade actuator means for reciprocally moving said blades together to clamp on a wire and apart to enable free passage of said wire between said blades, and clamp actuator means for reciprocally moving said clamp towards and away from said bonding tool.

52. The machine of claim 51 wherein said clamp actuator means is further defined as comprising in combination a clamp support, a clamp actuator motor located remotely from said head, and clamp actuator coupling means for coupling force produced by said clamp actuator motor to said clamp support.

53. The machine of claim 52 wherein said clamp actuator coupling means is further defined as comprising a clamp actuator drive shaft having a rotation axis coaxially aligned with said head rotation axis, input clamp actuator drive coupling means for coupling force produced by said clamp actuator motor to said clamp actuator drive shaft, and output clamp actuator drive coupling means for coupling motion of said drive shaft to said clamp support independently of rotation angle of said head relative to said head support means.

54. The machine of claim 53 wherein at least one of said head support spindle and said clamp actuator drive shaft fits coaxially within the other.

55. The machine of claim 54 wherein said claim actuator motor is further defined as being mounted to said head support assembly.

56. The machine of claim 55 wherein said clamp actuator drive means is further defined as including a cam wheel eccentrically mounted to a lower end of said clamp actuator drive shaft, and a bell crank which supports said clamp and which is pivotably mounted to said third, lower left longitudinally disposed linkage bar, said bell crank having protruding from an upper end thereof a cam follower having a rolling surface biased into contact with a circumferential surface of said cam wheel.

57. The machine of claim 56 wherein an inner one of said head drive spindle and said clamp actuator drive shaft has therethrough an axially disposed wire adapted to receive through an upper entrance opening to said bore bonding wire from a supply reel, and to pay out through a lower exit opening therein wire to said clamp assembly.

58. The machine of claim 57 further including a drag tube for frictionally resisting motion of wire supplied from a wire supply reel to said bore through said spindle, said drag tube comprising a curved tube having a straight lower portion secured in a bore disposed vertically through said transducer rearward of said tool, and an arcuately forwardly and upwardly angled upper portion.

59. An automatic ultrasonic wire bonding machine comprising;
 a. a gantry,
 b. a first, tool support platform translatably supported from said gantry,
 c. a first motor drive means for translating said first tool support platform in a first coordinate direction relative to said gantry, in response to first translational drive signals,
 d. a second tool support platform translatably supported from said first tool support platform,
 e. a second motor drive means for translating said second tool support platform in a second coordinate direction relative to said first tool support platform, in response to second translational drive signals,
 f. a third tool support platform translatably supported from said second tool support platform,
 g. a third motor drive means for translating said third tool support platform in a third coordinate direction relative to said second tool support platform, in response to third translational drive signals,
 h. an orbital bonding tool head support assembly protruding from said third tool support platform, for rotatably supporting an orbital bonding tool head,
 i. an orbital bonding tool head, including an upper support base portion rotatably coupled to said orbital bonding tool head support assembly, a parallelogram linkage frame which depends downwardly from said upper support base portion, and an ultrasonic transducer coupled to a lower portion of said parallelogram linkage frame, said parallelogram linkage frame including;
  i. a first, lower right-hand longitudinally disposed linkage bar pivotably coupled near a front end thereof by a first, front lower right pivot joint to a lower right side of said head,
  ii. a second, laterally disposed, vertically elongated rear bar member comprising a transducer support block pivotably coupled at a lower right side thereof to a rear end of said first linkage bar by a second, rear lower right pivot joint,
  iii. a third, lower left, longitudinally disposed linkage bar rigidly coupled to a lower left side of said second, laterally disposed rear bar member, and iv. a fourth, upper left longitudinally disposed linkage bar pivotably coupled near a front end thereof by a third, front upper left pivot joint to an upper left side of said head, and near a rear end thereof by a fourth, rear upper left pivot joint to an upper left side of said second, laterally disposed rear bar member, and j. a first rotational motor drive means for rotating said bonding tool head relative to said bonding tool head support assembly.

60. The automatic ultrasonic wire bonding machine of claim 59 wherein said bonding tool head is further defined as including a wire feed mechanism attached to a lower portion of said parallelogram linkage frame.

61. The automatic ultrasonic wire bonding machine of claim 60 wherein said bonding tool head is rotatably supported from said bonding tool head support assembly by means of a hollow head drive spindle which protrudes upwardly from said upper support base portion of said orbital bonding tool head and through a bearing journal fitted in said bonding tool head support assembly, an upwardly protruding end of said spindle being fitted with a first drive pulley.

62. The automatic ultrasonic wire bonding machine of claim 61 wherein said wire feed mechanism includes a clamp actuator drive shaft which is disposed coaxially upwards through said head drive spindle.

63. The automatic ultrasonic wire bonding machine of claim 62 wherein said clamp actuator drive shaft has attached coaxially thereto a second drive pulley located above said bearing journal through said orbital bonding tool head support assembly.

64. The automatic ultrasonic wire bonding machine of claim 63 wherein said first rotational drive means comprises in combination a first rotational drive motor and means for coupling rotary drive force produced thereby to said first drive pulley attached to said drive spindle.

65. The automatic ultrasonic wire bonding machine of claim 64 further including second rotational motor drive means coupled to said second, clamp actuator drive shaft pulley.

66. The automatic ultrasonic wire bonding machine of claim 65 wherein said clamp actuator drive shaft is further defined as having disposed axially through its length a bore enabling a wire supplied from a source above said head support assembly to transit through said orbital bonding tool head to said wire feed mechanism.

67. The machine of claim 1 wherein said orbital bonding tool head is rotatable by said rotational positioning means plus and minus 180 degrees from a reference position, thus enabling a plane containing a longitudinal axis and wire feed bore axis of said ultrasonic bonding tool to be rotated to any azimuthal direction relative to a workpiece.

* * * * *